(12) United States Patent
Lee et al.

(10) Patent No.: US 11,011,536 B2
(45) Date of Patent: May 18, 2021

(54) VERTICAL MEMORY DEVICE

(71) Applicant: SAMSUNG ELECTRONICS CO., LTD., Suwon-si (KR)

(72) Inventors: Byoung-Il Lee, Seoul (KR); Ji-Mo Gu, Seoul (KR); Hyun-Mog Park, Seoul (KR); Tak Lee, Hwaseong-si (KR); Jun-Ho Cha, Seongnam-si (KR); Sang-Jun Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/941,917

(22) Filed: Mar. 30, 2018

(65) Prior Publication Data

US 2019/0035805 A1 Jan. 31, 2019

(30) Foreign Application Priority Data

Jul. 25, 2017 (KR) .......................... 10-2017-0094344

(51) Int. Cl.
| | | |
|---|---|---|
| *H01L 27/11582* | (2017.01) | |
| *H01L 29/423* | (2006.01) | |
| *H01L 29/10* | (2006.01) | |
| *H01L 27/1157* | (2017.01) | |

(52) U.S. Cl.
CPC .... *H01L 27/11582* (2013.01); *H01L 27/1157* (2013.01); *H01L 29/1037* (2013.01); *H01L 29/4234* (2013.01)

(58) Field of Classification Search
CPC .......... H01L 27/11582; H01L 29/4234; H01L 27/1157; H01L 29/1037; H01L 27/11578; H01L 27/11573; H01L 23/5283; H01L 23/481
See application file for complete search history.

(56) References Cited

U.S. PATENT DOCUMENTS

| | | |
|---|---|---|
| 8,133,784 B2 | 3/2012 | Chung et al. |
| 8,564,050 B2 | 10/2013 | Park et al. |
| 8,575,681 B2 | 11/2013 | Matsuda et al. |
| 8,643,084 B2 | 2/2014 | Shin et al. |
| 8,685,821 B2 | 4/2014 | Eom et al. |

(Continued)

FOREIGN PATENT DOCUMENTS

KR 1020130090601 8/2013

*Primary Examiner* — Cuong B Nguyen
*Assistant Examiner* — Juanita B Rhodes
(74) *Attorney, Agent, or Firm* — F. Chau & Associates, LLC

(57) ABSTRACT

A vertical memory device includes gate electrodes spaced apart from each other in a first direction. Each of the gate electrodes extends in a second direction. Insulation patterns extend in the second direction between adjacent gate electrodes. A channel structure extends in the first direction. The channel structure extends through at least a portion of the gate electrode structure and at least a portion of the insulation pattern structure. The gate electrode structure includes at least one first gate electrode and a plurality of second gate electrodes sequentially stacked in the first direction on the substrate. Lower and upper surfaces of a first insulation pattern are bent away from the upper surface of the substrate along the first direction. A sidewall connecting the lower and upper surfaces of the first insulation pattern is slanted with respect to the upper surface of the substrate.

20 Claims, 27 Drawing Sheets

(56) References Cited

U.S. PATENT DOCUMENTS

| | | |
|---|---|---|
| 8,987,803 B2 | 3/2015 | Chae et al. |
| 9,576,966 B1 | 2/2017 | Peri et al. |
| 2012/0267701 A1* | 10/2012 | Chae .................. G11C 5/02 |
| | | 257/324 |
| 2015/0064885 A1* | 3/2015 | Lee .................. H01L 27/11556 |
| | | 438/488 |
| 2016/0343728 A1 | 11/2016 | Song |

* cited by examiner

VERTICAL MEMORY DEVICE

CROSS-REFERENCE TO RELATED APPLICATION

This application claims priority under 35 USC § 119 to Korean Patent Application No. 10-2017-0094344, filed on Jul. 25, 2017 in the Korean Intellectual Property Office (KIPO), the disclosure of which is incorporated by reference herein in its entirety.

1. TECHNICAL FIELD

Exemplary embodiments of the present inventive concept relate to a memory device, and more particularly to a vertical memory device.

2. DISCUSSION OF RELATED ART

A GSL at a lowermost level in a VNAND flash memory device may be formed with a defect when a source gas does not fill a gap for forming the GSL.

SUMMARY

According to an exemplary embodiment of the present inventive concept, a vertical memory device includes a gate electrode structure including gate electrodes spaced apart from each other on a substrate in a first direction substantially perpendicular to an upper surface of the substrate in a first direction substantially perpendicular to an upper surface of the substrate. Each of the gate electrodes extends in a second direction substantially parallel to the upper surface of the substrate. An insulation pattern structure includes insulation patterns. Each of the insulation patterns extends in the second direction between adjacent gate electrodes of the gate electrodes. A channel structure extends in the first direction on the substrate. The channel structure extends through at least a portion of the gate electrode structure and at least a portion of the insulation pattern structure. The gate electrode structure includes at least one first gate electrode and a plurality of second gate electrodes sequentially stacked in the first direction on the substrate. Lower and upper surfaces of a first insulation pattern are bent away from the upper surface of the substrate along the first direction. The first insulation pattern is between the first gate electrode and a lowermost one of the plurality of second gate electrodes. A sidewall connecting the lower and upper surfaces of the first insulation pattern is slanted with respect to the upper surface of the substrate.

According to an exemplary embodiment of the present inventive concept, a vertical memory device includes a gate electrode structure including gate electrodes spaced apart from each other on a substrate in a first direction substantially perpendicular to an upper surface of the substrate. Each of the gate electrodes extends in a second direction substantially parallel to the upper surface of the substrate. An insulation pattern structure includes insulation patterns. Each of the insulation patterns extends in the second direction between the gate electrodes. A channel structure extends in the first direction on the substrate. The channel structure extends through at least a portion of the gate electrode structure and at least a portion of the insulation pattern structure. A plurality of second gate electrodes of the gate electrodes each include a sidewall having a thickness in the first direction equal to that of a central portion in a third direction of each of the second gate electrodes. The third direction is substantially parallel to the upper surface of the substrate and substantially perpendicular to the second direction. A first gate electrode of the gate electrodes includes a sidewall having a thickness in the first direction greater than that of a central portion in the third direction of the first gate electrode.

According to an exemplary embodiment of the present inventive concept, a vertical memory device includes gate electrodes spaced apart from each other on a substrate in a first direction substantially perpendicular to an upper surface of the substrate. Each of the gate electrodes extends in a second direction substantially parallel to the upper surface of the substrate. The vertical memory device includes insulation patterns. Each of the insulation patterns extend in the second direction between the gate electrodes. A channel extends through at least one of the gate electrodes and at least one of the insulation patterns. A first insulation pattern of the insulation patterns has lower and upper surfaces bent in a direction away from the upper surface of the substrate. Each of second insulation patterns of the insulation patterns above the first insulation pattern has lower and upper surfaces substantially parallel to the upper surface of substrate.

In the vertical memory device in accordance with an exemplary embodiment of the present inventive concept, even if the GSL is formed at a lowermost level, the source gas for forming the GSL may completely fill a space for forming the GSL, and thus a resulting GSL may be more reliable and an occurrence of defects in the GSL may be reduced or eliminated.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

The above and other aspects and features of the vertical memory devices and the methods of manufacturing the same in accordance with example embodiments will become readily understood from the more detailed descriptions that follow, with reference to the accompanying drawings.

Figure 1:
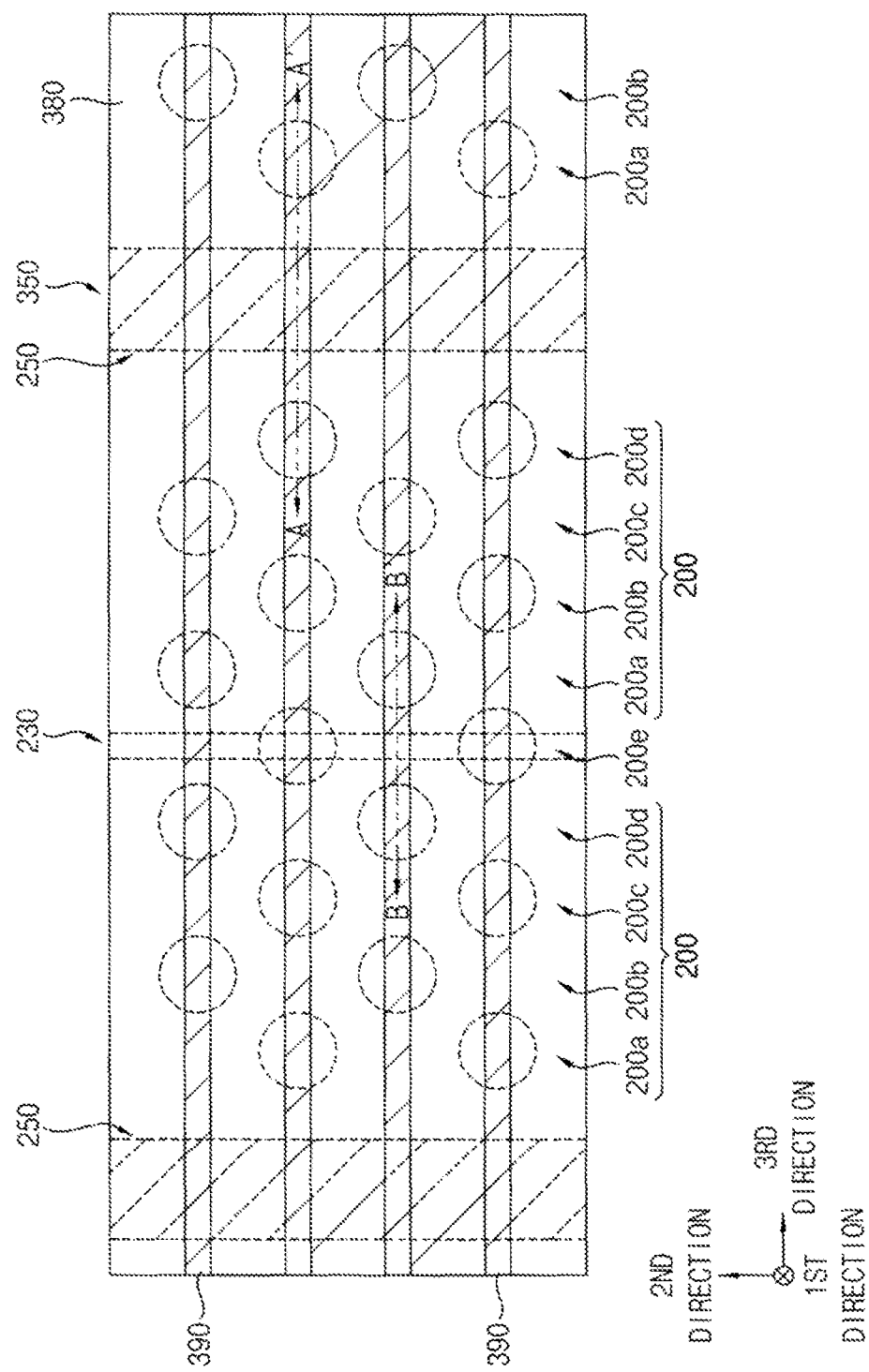
FIG. 1 is a plan view.
Figure 2A:
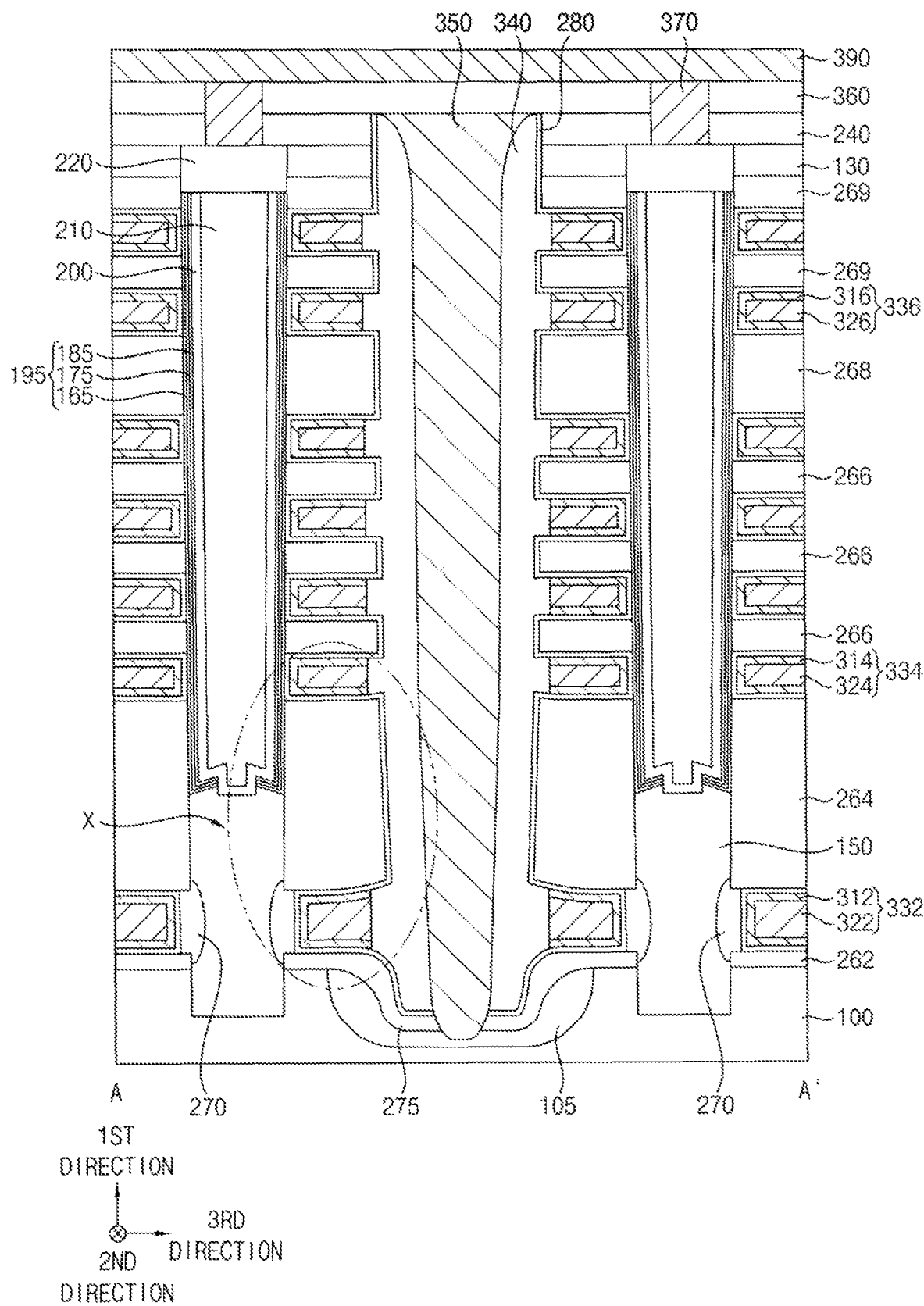
FIGS. 2A, 2B and 3 are cross-sectional views illustrating a vertical memory device in accordance with an exemplary embodiment of the present inventive concept.
Figure 2B:
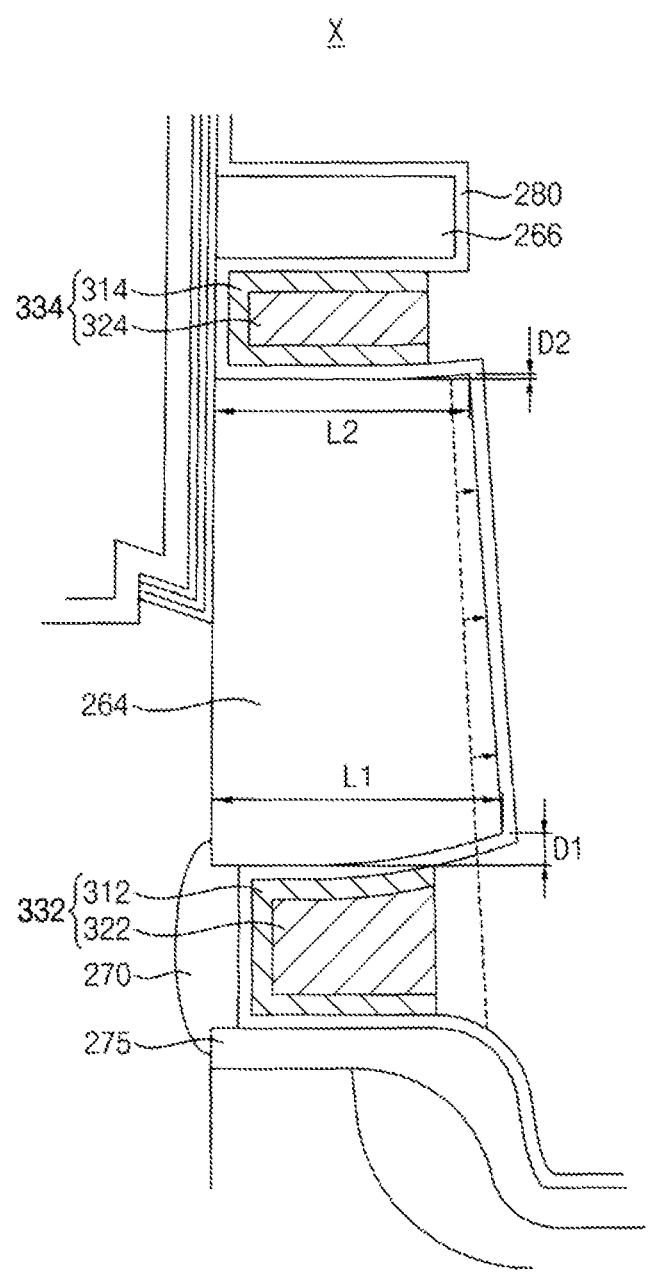
Figure 3:
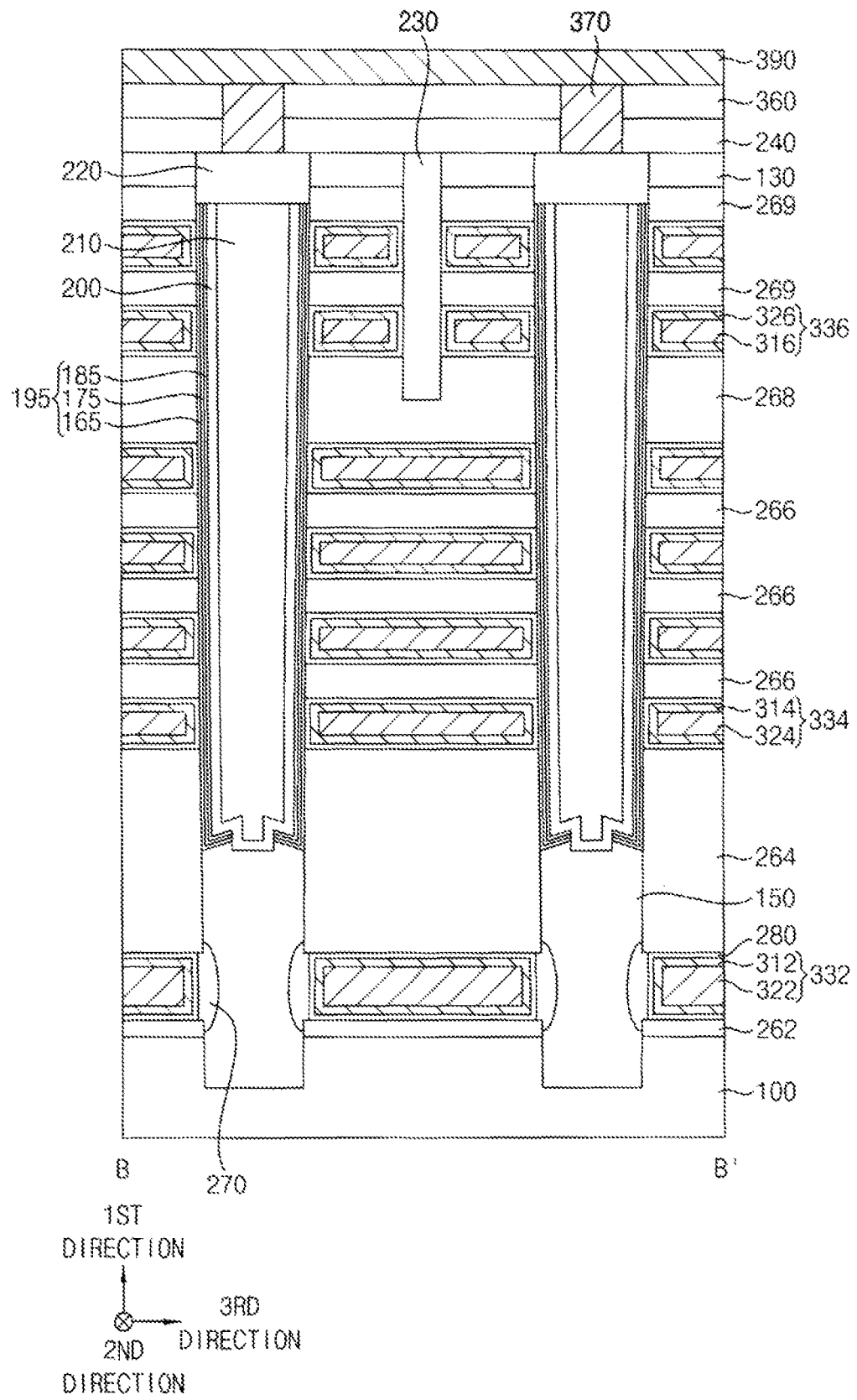

FIG. 1 is a plan view, and FIGS. 2A, 2B and 3 are cross-sectional views illustrating a vertical memory device in accordance with an exemplary embodiment of the present inventive concept. Particularly, FIG. 1 is a plan view, and FIGS. 2A, 2B and 3 are cross-sectional views. FIGS. 2A and 2B are cross-sectional views taken along a line A-A' of FIG. 1, and FIG. 3 is a cross-sectional view taken along a line B-B' of FIG. 1. FIG. 2B is an enlarged cross-sectional view of a region X in FIG. 2A.

Referring to FIGS. 1, 2A, 2B and 3, the vertical memory device may include a gate electrode structure on a substrate 100, a first structure extending through the gate electrode structure, and an insulation pattern structure. The vertical memory device may further include a capping pattern 220, a division layer 230, first and second gate insulation patterns 270 and 275, a second blocking layer 280, a second spacer 340, a common source line (CSL) 350, a contact plug 370, a bit line 390, and first to fourth insulating interlayers 130, 240, 360 and 380.

The substrate 100 may include silicon, germanium, silicon-germanium or a III-V compound such as GaP, GaAs, or GaSb. In an exemplary embodiment of the present inventive concept, the substrate 100 may be a silicon-on-insulator (SOI) substrate or a germanium-on-insulator (GOI) substrate.

The gate electrode structure may include a plurality of gate electrodes at a plurality of levels, respectively, which may be spaced apart from each other in a first direction substantially perpendicular to an upper surface of the substrate 100. For example, the first direction may be orthogonal to the upper surface of the substrate. The gate structure may extend in a second direction parallel to the upper surface of the substrate 100, and a plurality of gate structures may be disposed in a third direction parallel to the upper surface of the substrate 100 and substantially perpendicular to the second direction. As an example, the plurality of gate electrode structures extending in the second direction at a same level as each other may be spaced apart from each other in the third direction (e.g., by a second opening 250 extending in the second direction and disposed between the plurality of gate electrode structures).

In an exemplary embodiment of the present inventive concept, the CSL 350 extending in the second direction may be formed in the second opening 250, and the second spacer 340 may be formed on each of opposite sides of the CSL 350 in the third direction. Thus, the second spacer 340 may be in direct contact with side surfaces of the CSL 350. The CSL 350 may include a metal, a metal nitride, and/or a metal silicide, and the second spacer 340 may include an oxide, e.g., silicon oxide.

Each of the gate electrode structures may include at least one first gate electrode 332, a plurality of second gate electrodes 334, and at least one third gate electrode 336 sequentially stacked in the first direction on the substrate 100. The at least one first gate electrode 332, the plurality of second gate electrodes 334, and the at least one third gate electrode 336 may be spaced apart from each other along the first direction above the substrate 100.

In an exemplary embodiment of the present inventive concept, the first gate electrode 332 may serve as a ground selection line (GSL), each of the second gate electrodes 334 may serve as a word line, and the third gate electrode 336 may serve as a string selection line (SSL). FIGS. 2A and 3 illustrate one first gate electrode 332 at one level, four second gate electrodes 334 at four levels, respectively, and two third gate electrodes 336 at two levels, respectively; however, exemplary embodiments of the present inventive concept are not limited thereto. Thus, each of the first to third gate electrodes 332, 334 and 336 may be formed at one level or more than one levels.

The first gate electrode 332 may include a first gate conductive pattern 322 extending in the second direction, and a first gate barrier pattern 312 covering top and bottom surfaces and at least a portion of a sidewall of the first gate conductive pattern 322, the second gate electrode 334 may include a second gate conductive pattern 324 extending in the second direction, and a second gate barrier pattern 314 covering top and bottom surfaces and at least a portion of a sidewall of the second conductive pattern 324, and the third gate electrode 336 may include a third gate conductive pattern 326 extending in the second direction, and a third gate barrier pattern 316 covering top and bottom surfaces and at least a portion of a sidewall of the third gate conductive pattern 326.

The first to third gate conductive patterns 322, 324 and 326 may include a metal having a relatively low resistance, e.g., tungsten, titanium, tantalum, or platinum, and the first to third gate barrier patterns 312, 314 and 316 may include a metal nitride, e.g., titanium nitride, or tantalum nitride.

In an exemplary embodiment of the present inventive concept, the first gate electrode 332 may have a thickness in the first direction greater than those of the second and third gate electrodes 334 and 336. Each of opposite ends of the first gate electrode 332 in the third direction, (e.g., each portion of the first gate electrode 332 adjacent the second opening 250) may have a thickness in the first direction greater than that of a central portion of the first gate electrode 332 in the third direction. For example, a sidewall of the first gate electrode 332 facing the second opening 250 may have a thickness along the first direction greater than that of a central portion of the first gate electrode 332 spaced apart from the sidewall of the first gate electrode 332 along the third direction. An upper surface of each of the opposite ends of the first gate electrode 332 may be bent upwardly (e.g., in a direction away from the upper surface of the substrate 100). Alternatively, each of opposite ends of the first gate electrode 332 in the third direction may have a thickness in the first direction equal to that of the central portion of the first gate electrode 332 in the third direction.

The first structure may be a channel structure extending through the gate electrode structure in the first direction on the substrate 100. Particularly, the first structure may include a lower channel 150 protruding from the substrate 100 in the first direction, an upper channel 200 extending from a central upper surface of the lower channel 150 in the first direction, a charge storage structure 195 covering an outer sidewall of the upper channel 200 on the lower channel 150, and a filling pattern 210 for filling an inner space defined by the upper channel 200.

The lower channel 150 may have a pillar shape, and may have a recess at a portion of a sidewall facing the first gate electrode 332. The first gate insulation pattern 270 may substantially fill the recess, and may protrude from the first gate electrode 332 toward the lower channel 150 in a horizontal direction (e.g., in the third direction) to have a ring shape or a curved shape. The first gate insulation pattern 270 may include an oxide, e.g., silicon oxide. The lower channel 150 may partially extend through an upper portion of the substrate 100. The lower channel 150 may include a crystalline semiconductor material doped with n-type or p-type impurities.

In an exemplary embodiment of the present inventive concept, the upper channel 200 may have a cup-like shape (e.g., an open substantially cylindrical shape) on the lower channel 150, and the filling pattern 210 may fill an inner space formed by the upper channel 200. Thus, a bottom and a sidewall of the filling pattern 210 may be at least covered by the upper channel 200.

The upper channel 200 may include, e.g., crystalline silicon, and the filling pattern 210 may include an oxide, e.g., silicon oxide.

In an exemplary embodiment of the present inventive concept, the charge storage structure 195 surrounding the outer sidewall of the upper channel 200 may have a cup-like shape (e.g., an open substantially cylindrical shape) of which a bottom is opened. The charge storage structure 195 may include a tunnel insulation pattern 185, a charge storage pattern 175, and a first blocking pattern 165 sequentially stacked on the outer sidewall of the upper channel 200.

The tunnel insulation pattern 185 and the first blocking pattern 165 may include an oxide, e.g., silicon oxide, and the charge storage pattern 175 may include a nitride, e.g., silicon nitride.

The first structure including the lower channel 150, the upper channel 200, the charge storage structure 195, and the filling pattern 210 may have a pillar shape extending in the first direction from the upper surface of the substrate 100. The first structure may have a diameter substantially constant in the first direction, or a diameter gradually increasing in the first direction from a bottom toward a top thereof.

The capping pattern 220 may be formed on an upper surface of the first structure, the contact plug 370 may be formed on an upper surface of the capping pattern 220, and the bit line 390 may be formed on an upper surface of the contact plug 370. The capping pattern 220 may be in direct contact with the upper surface of the first structure, which may be a channel structure. The capping pattern 220 may extend through the first insulating interlayer 130 and a fifth insulation pattern 269 (described in more detail below) to be in direct contact with the upper surface of the first structure, the contact plug 370 may extend through the second and third insulating interlayers 240 and 360 to be in direct contact with the upper surface of the capping pattern 220, and the bit line 390 may extend through the fourth insulating interlayer 380 to be in direct contact with the upper surface of the contact plug 370.

The capping pattern 220 may include doped or undoped polysilicon or single crystalline silicon, the contact plug 370 and the bit line 390 may include a metal, e.g., copper, aluminum, tungsten, titanium, or tantalum, and/or a metal nitride, e.g., titanium nitride, tantalum nitride, or tungsten nitride, and the first to fourth insulating interlayers 130, 240, 360 and 380 may each include an oxide, e.g., silicon oxide.

In an exemplary embodiment of the present inventive concept, a plurality of first structures including the lower and upper channels 150 and 200 may be formed in each of the second and third directions, and thus a first structure array may be defined.

A plurality of upper channels 200 may be formed in each of the second and third directions to define a channel array. In an exemplary embodiment of the present inventive concept, the channel array may include a first channel column 200a including first channels disposed in the second direction, and a second channel column 200b including second channels disposed in the second direction and being spaced apart from the first channel column 200a in the third direction. The second channels may be disposed to have acute angles with the second direction or the third direction from the first channels.

The first and second channel columns 200a and 200b may be alternately and repeatedly arranged in the third direction.

FIG. 1 shows one channel group including five first channel columns 200a and four second channel columns 200b alternately arranged in the third direction; however, exemplary embodiments of the present inventive concept are not limited thereto.

Below, as an example, four channel columns disposed in the third direction in a channel group may be referred to as first, second, third and fourth channel columns 200a, 200b, 200c and 200d, respectively, in this order, one channel column at a central position in the third direction in the channel group may be referred to as a fifth channel column 200e, and the other four channel columns disposed in the third direction in the channel group may be referred to as the first, second, third and fourth channel columns 200a, 200b, 200c and 200d, respectively, again in this order. The first to fourth channel columns 200a, 200b, 200c and 200d may define a channel block. FIG. 1 shows a channel array including one channel group and a portion of another channel group spaced apart from the one channel group in the third direction, and each of the channel groups includes two channel blocks disposed in the third direction.

A sidewall of the first gate electrode 332 serving as the GSL may face the first gate insulation pattern 270 on a sidewall of the lower channel 150, and the second and third gate electrodes 334 and 336 serving as the word line and the SSL, respectively, may face a sidewall of the charge storage structure 195 on the outer sidewall of the upper channel 200.

The insulation pattern structure may include first, second, third, fourth and fifth insulation patterns 262, 264, 266, 268 and 269 sequentially stacked in the first direction on the substrate 100. The first insulation pattern 262 may be disposed between the upper surface of the substrate 100 and the first gate electrode 332, the second insulation pattern 264 may be disposed between the first and second gate electrodes 332 and 334, the third insulation pattern 266 may be disposed between the second gate electrodes 334, the fourth insulation pattern 268 may be disposed between the second and third gate electrodes 334 and 336, and the fifth insulation pattern 269 may be disposed between the third gate electrodes 336 or on the third gate electrode 336.

FIGS. 2A and 3 show the first to fifth insulation patterns 262, 264, 266, 268 and 269 are formed at one, one, three, one and two levels, respectively; however, exemplary embodiments of the present inventive concept are not limited thereto. Thus, each of the first to fifth insulation patterns 262, 264, 266, 268 and 269 may be formed in at least one level or in a plurality of levels.

In an exemplary embodiment of the present inventive concept, each of the first to fifth insulation patterns 262, 264, 266, 268 and 269 at each level may extend in the second direction. A plurality of first insulation patterns 262 may be spaced apart from each other in the third direction at each level by the second opening 250. A plurality of second insulation patterns 264 may be spaced apart from each other in the third direction at each level by the second opening 250. A plurality of third insulation patterns 266 may be spaced apart from each other in the third direction at each level by the second opening 250. A plurality of fourth insulation patterns 268 may be spaced apart from each other in the third direction at each level by the second opening 250. A plurality of fifth insulation patterns 269 may be spaced apart from each other in the third direction at each level by the second opening 250. The first to fifth insulation patterns 262, 264, 266, 268 and 269 may include an oxide, e.g., silicon oxide.

In an exemplary embodiment of the present inventive concept, the first insulation pattern 262 may have a thickness in the first direction less than those of the second to fifth insulation patterns 264, 266, 268 and 269, and the thicknesses of the second and fourth insulation patterns 264 and 268 in the first direction may be greater than that of the third insulation pattern 266 or of the fifth insulation pattern 269. As an example, the thickness of the second insulation pattern 264 may be greater than that of the fourth insulation pattern 268, and may be about 5 times to about 10 times the thickness of the third insulation pattern 266.

As an example, the second gate insulation pattern 275 may be formed between the upper surface of the substrate 100 and each of opposite ends of the first gate electrode 332 in the third direction, (e.g., each portion of the first gate electrode 332 adjacent the second opening 250). The second gate insulation pattern 275 may include, e.g., silicon oxide, and thus may be merged with the first insulation pattern 262. However, the second gate insulation pattern 275 need not be formed between the upper surface of the substrate 100 and the central portion of the first gate electrode 332 in the third direction.

In an exemplary embodiment of the present inventive concept, upper and lower surfaces of each of opposite ends of the second insulation pattern 264 in the third direction (e.g., upper and lower surfaces of each portion of the second insulation pattern 264 adjacent the second opening 250) may be bent upwardly in the direction away from the upper surface of the substrate 100. As an example, the lower surface of each of opposite ends of the second insulation pattern 264 may be spaced apart by a first distance D from a plane extending from a lower surface of other portions, e.g., a central portion of the second insulation pattern 264 extending in a direction parallel to the upper surface of the substrate 100, and the upper surface of each of opposite ends of the second insulation pattern 264 may be spaced apart by a second distance D2 from a plane extending from an upper surface of the central portion of the second insulation pattern 264.

In an exemplary embodiment of the present inventive concept, the second distance D2 may be less than the first distance D1, and thus a degree of upward bending of the lower surface of the second insulation pattern 264 may be greater than that of the upper surface of the second insulation pattern 264 (e.g., at each of opposite ends thereof). In an exemplary embodiment of the present inventive concept, a first length L1 of the upper surface of each of opposite ends of the second insulation pattern 264 from a sidewall of a nearest one of the first structures may be greater than a second length L2 of the lower surface of each of opposite ends of the second insulation pattern 264 from the sidewall of the nearest one of the first structures. Accordingly, a sidewall of the second insulation pattern 264 connecting the lower and upper surfaces thereof need not be perpendicular to the upper surface of the substrate 100, but may be slanted with respect to the upper surface of the substrate 100.

In an exemplary embodiment of the present inventive concept, the second opening 250 may have a width gradually increasing in the first direction from a bottom toward a top thereof, and thus a slope with respect to the upper surface of the substrate 100 of sidewalls of each of opposite ends of the first to fifth insulation patterns 262, 264, 266, 268 and 269 sequentially stacked in the first direction upwardly adjacent the second opening 250 may gradually increase. Alternatively, the second opening 250 may have a width substantially constant in the first direction from the bottom toward the top thereof, and thus the slope with respect to the upper surface of the substrate 100 of sidewalls of each of opposite ends of the first to fifth insulation patterns 262, 264, 266, 268 and 269 adjacent the second opening 250 may be substantially 90 degrees.

As an example, the slope of the sidewall of each of opposite ends of the second insulation pattern 264 may be less than 90 degrees, which may be less than those of the sidewalls of each of opposite ends of the overlying third to fifth insulation patterns 266, 268 and 269.

The lower surface of each of opposite ends of the second insulation pattern 264 may be bent upwardly, and thus, when the first gate electrode 332 serving as a GSL beneath the second insulation pattern 264 is formed, a source gas may be easily provided into a first gap 252 (see, e.g., FIGS. 16 and 17) for forming the first gate electrode 332, and thus manufacturing yield of the first gate electrode 332 may be increased, and reliability of the first gate electrode 332 may be increased.

A thickness of each of opposite ends of the first gate electrode 332 in the third direction may gradually increase toward the second opening 250, according to a degree of wet etching process after depositing a metal in the first gap 252.

The division layer 230 may extend through the first insulating interlayer 130, the third gate electrodes 336, and the fifth insulation patterns 269, and may also extend through an upper portion of the fourth insulation pattern 268. Thus, the third gate electrodes 336 at each level may be spaced apart from each other in the third direction by the division layer 230.

In an exemplary embodiment of the present inventive concept, the division layer 230 may extend in the second direction between two channel blocks in one channel group, and may extend through upper portions of channels 200 included in the fifth channel column 200e.

The second blocking layer 280 may be formed on upper and lower surfaces and portions of sidewalls of the gate electrodes 332, 334 and 336, and the sidewalls of the first to fifth insulation patterns 262, 264, 266, 268 and 269. The second blocking layer 280 may also be in direct contact with sidewalls of the charge storage structure 195 and the first gate insulation pattern 270.

FIGS. 4 to 19 are cross-sectional views illustrating a method of manufacturing a vertical memory device in accordance with an exemplary embodiment of the present inventive concept. Particularly, FIGS. 5, 9, 12 and 14 are plan views, and FIGS. 4, 6-8, 10-11, 13 and 15-19 are cross-sectional views. FIGS. 4, 6-8, 10-11 and 15-19 are cross-sectional views taken along lines A-A' of corresponding plan views, and FIG. 13 is a cross-sectional view taken along a line B-B' of FIG. 12.

Figure 4:
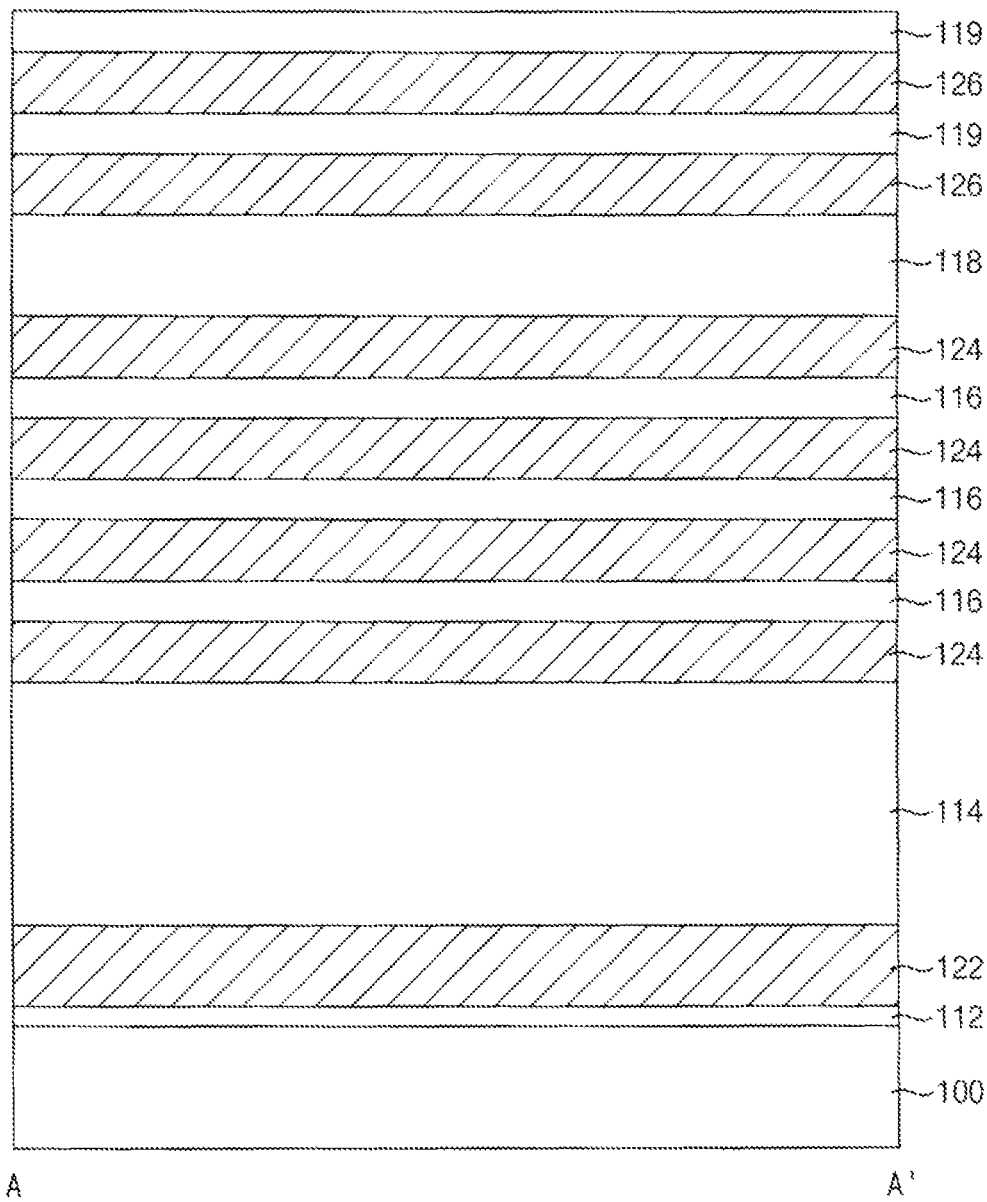
FIGS. 4 to 19 are cross-sectional views illustrating a method of manufacturing a vertical memory device in accordance with an exemplary embodiment of the present inventive concept.

Referring to FIG. 4, an insulation layer and a sacrificial layer may be alternately and repeatedly formed on a substrate 100. Thus, a plurality of insulation layers and a plurality of sacrificial layers may be alternately and repeatedly stacked on each other in the first direction.

The plurality of insulation layers may include first, second, third, fourth and fifth insulation layers 112, 114, 116, 118 and 119 sequentially stacked in the first direction, and the sacrificial layers may include first, second and third sacrificial layers 122, 124 and 126 sequentially stacked in the first direction. The first insulation layer 112 may be formed between an upper surface of the substrate 100 and the first sacrificial layer 122, the second insulation layer 114 may be formed between the first sacrificial layer 122 and the second sacrificial layer 124, the third insulation layer 116 may be formed between the second sacrificial layers 124, the fourth insulation layer 118 may be formed between the second sacrificial layer 124 and the third sacrificial layer 126, and the fifth insulation layer 119 may be formed between the third sacrificial layers 126 or on the third sacrificial layer 126.

FIG. 4 shows, as an example, that the first to fifth insulation layers 112, 114, 116, 118 and 119 are formed at one, one, three, one and two levels, respectively; however, exemplary embodiments of the present inventive concept are not limited thereto. FIG. 4 shows, as an example, that the first to third sacrificial layers 122, 124 and 126 are formed at one, four and two levels, respectively; however, exemplary embodiments of the present inventive concept are not limited thereto.

In an exemplary embodiment of the present inventive concept, the first insulation layer 112 may have a thickness in the first direction less than those of the second to fifth insulation layers 114, 116, 118 and 119, and the thicknesses of the second and fourth insulation layers 114 and 118 in the first direction may be greater than that of the third insulation layer 116 or of the fifth insulation layer 119. As an example, the thickness of the second insulation layer 114 may be greater than that of the fourth insulation layer 118, and may be, e.g., about 5 times to about 10 times the thickness of the third insulation layer 116.

The first sacrificial layer 122 may have a thickness in the first direction greater than those of the second and third sacrificial layers 124 and 125.

The insulation layer and the sacrificial layer may be formed by, e.g., a chemical vapor deposition (CVD) process, a plasma enhanced chemical vapor deposition (PE-CVD) process, or an atomic layer deposition (ALD) process. In an exemplary embodiment of the present inventive concept, a lowermost one of the insulation layers (e.g., the first insulation layer 112) may be formed by a thermal oxidation process on an upper surface of the substrate 100.

Figure 5:
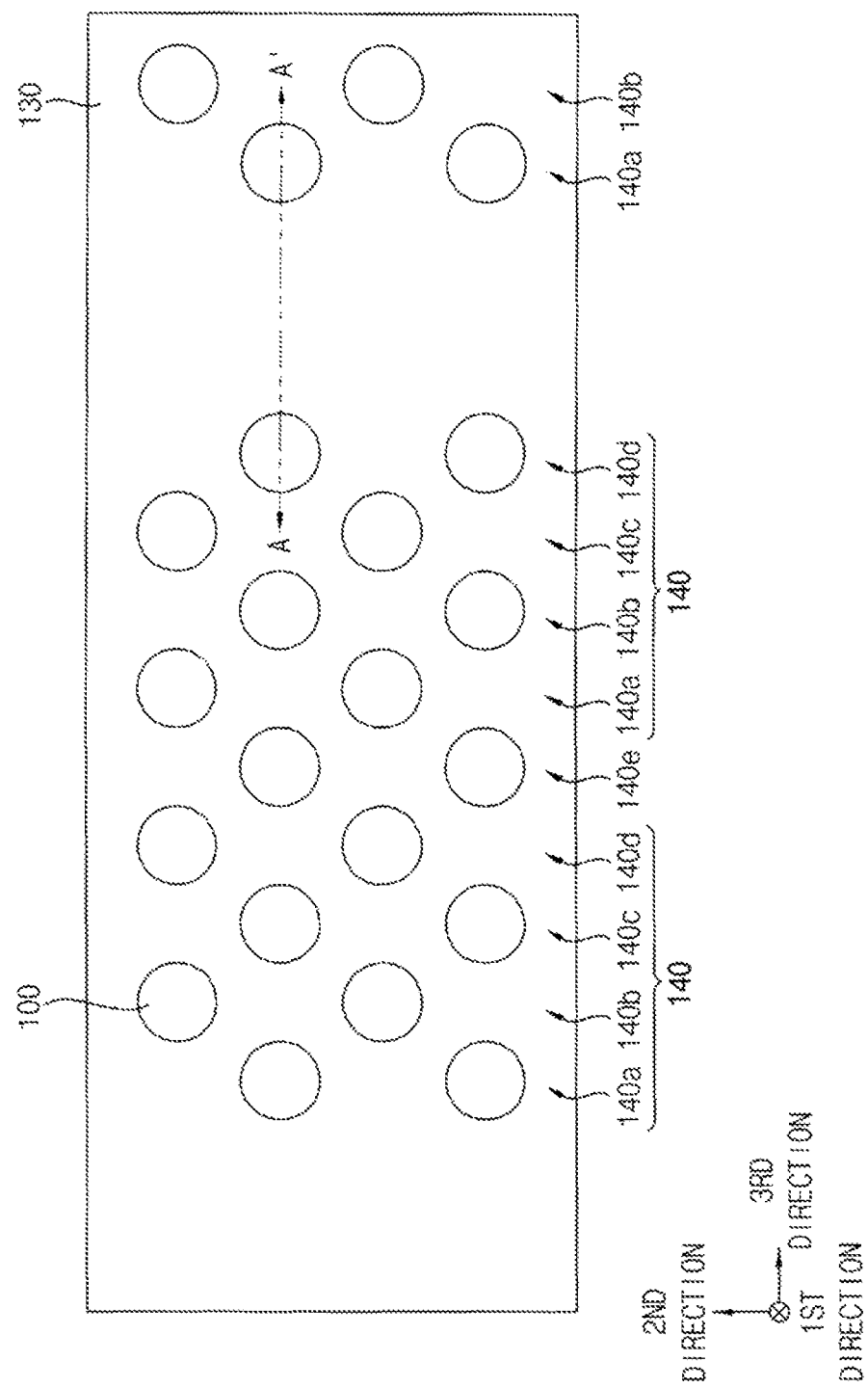
Figure 6:
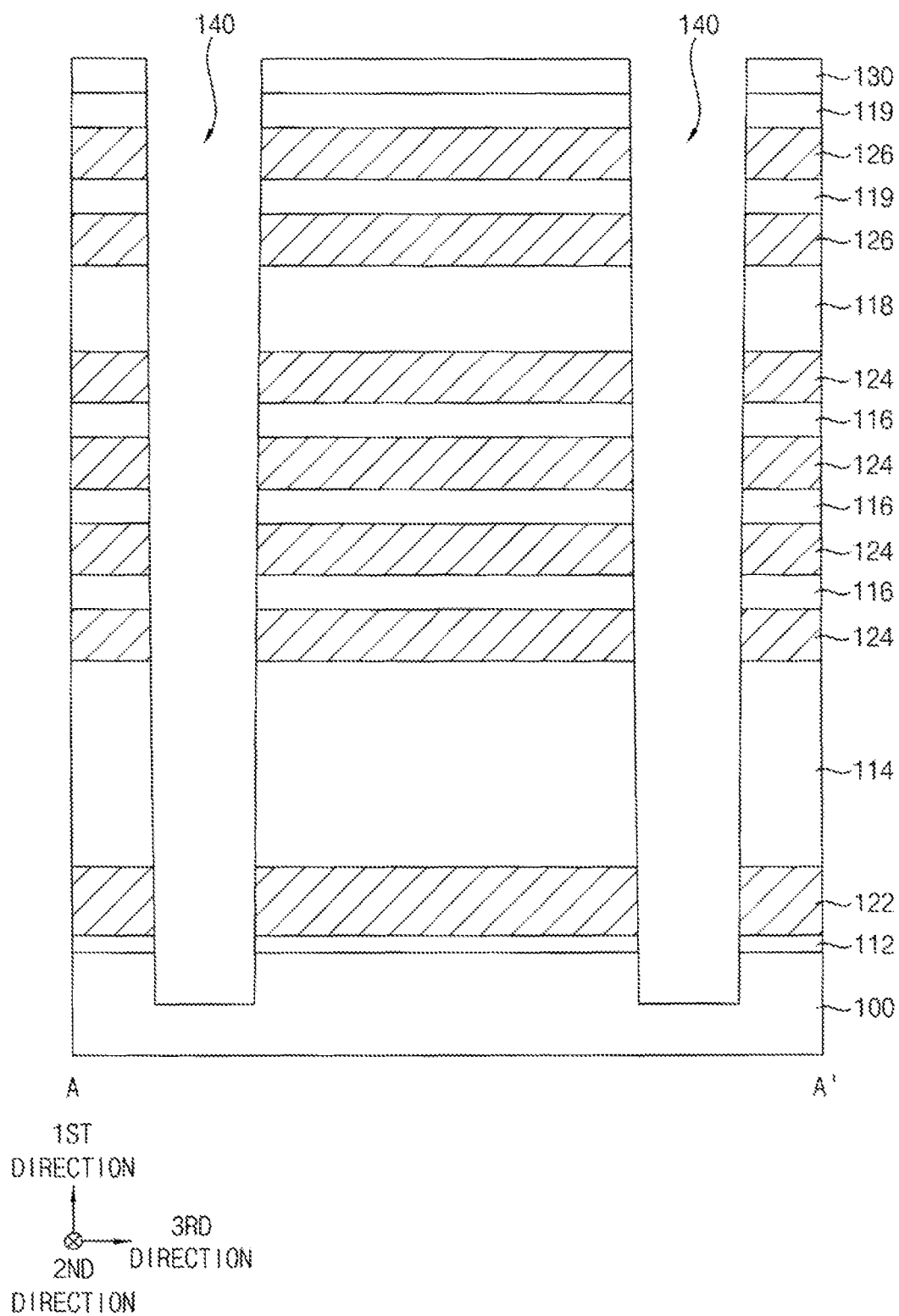

Referring to FIGS. 5 and 6, the first insulating interlayer 130 may be formed on an uppermost one of the fifth insulation layers 119, and an etching process may be performed using a photoresist pattern as an etching mask to form a plurality of channel holes 140 through the first insulating interlayer 130, the first to fifth insulation layers 112, 114, 116, 118 and 119, and the first to third sacrificial layers 122, 124 and 126 exposing upper surfaces of the substrate 100. During the etching process, upper portions of the substrate 100 may be also partially etched.

In an exemplary embodiment of the present inventive concept, each of the channel holes 140 may have a diameter gradually decreasing from a top toward a bottom thereof, due to the characteristics of the etching process. As an example, a sidewall of each of the channel holes 140 need not be substantially perpendicular to the upper surface of the substrate 100, but may be slanted with respect to the upper surface of the substrate 100. Alternatively, the sidewall of each of the channel holes 140 may be substantially perpendicular to the upper surface of the substrate 100 according to the etching process.

In an exemplary embodiment of the present inventive concept, a plurality of channel holes 140 may be formed in each of the second and third directions to form a channel hole array. In an exemplary embodiment of the present inventive concept, the channel hole array may include a first channel hole column 140a including a plurality of first channel holes arranged in the second direction, and a second channel hole column 140b spaced apart from the first channel hole column 140a in the third direction and including a plurality of second holes arranged in the second direction. The second channel holes may be formed in positions having acute angles with in the second direction or the third direction with respect to positions of the first channel holes. Thus, the channel holes of the first channel hole column 140a might not overlap the channel holes of the second channel hole column 140b along the third direction.

The first and second channel hole columns 140a and 140b may be alternately and repeatedly arranged in the third direction. FIG. 5 shows five first channel hole columns 140a and four second channel hole columns 140b are alternately arranged in the third direction to form one channel hole group; however, exemplary embodiments of the present inventive concept are not limited thereto.

Herein, four channel hole columns disposed in the third direction in a channel hole group may be referred to as first, second, third and fourth channel hole columns 140a, 140b, 140c and 140d, respectively, in this order. For example, one channel hole column at a central position in the third direction in the channel hole group may be referred to as a fifth channel hole column 140e, and the other four channel hole columns disposed in the third direction in the channel hole group may be referred to as the first, second, third and fourth channel hole columns 140a, 140b, 140c and 140d, respectively, again in this order. The first to fourth channel hole columns 140a, 140b, 140c and 140d may define a channel hole block.

Figure 7:
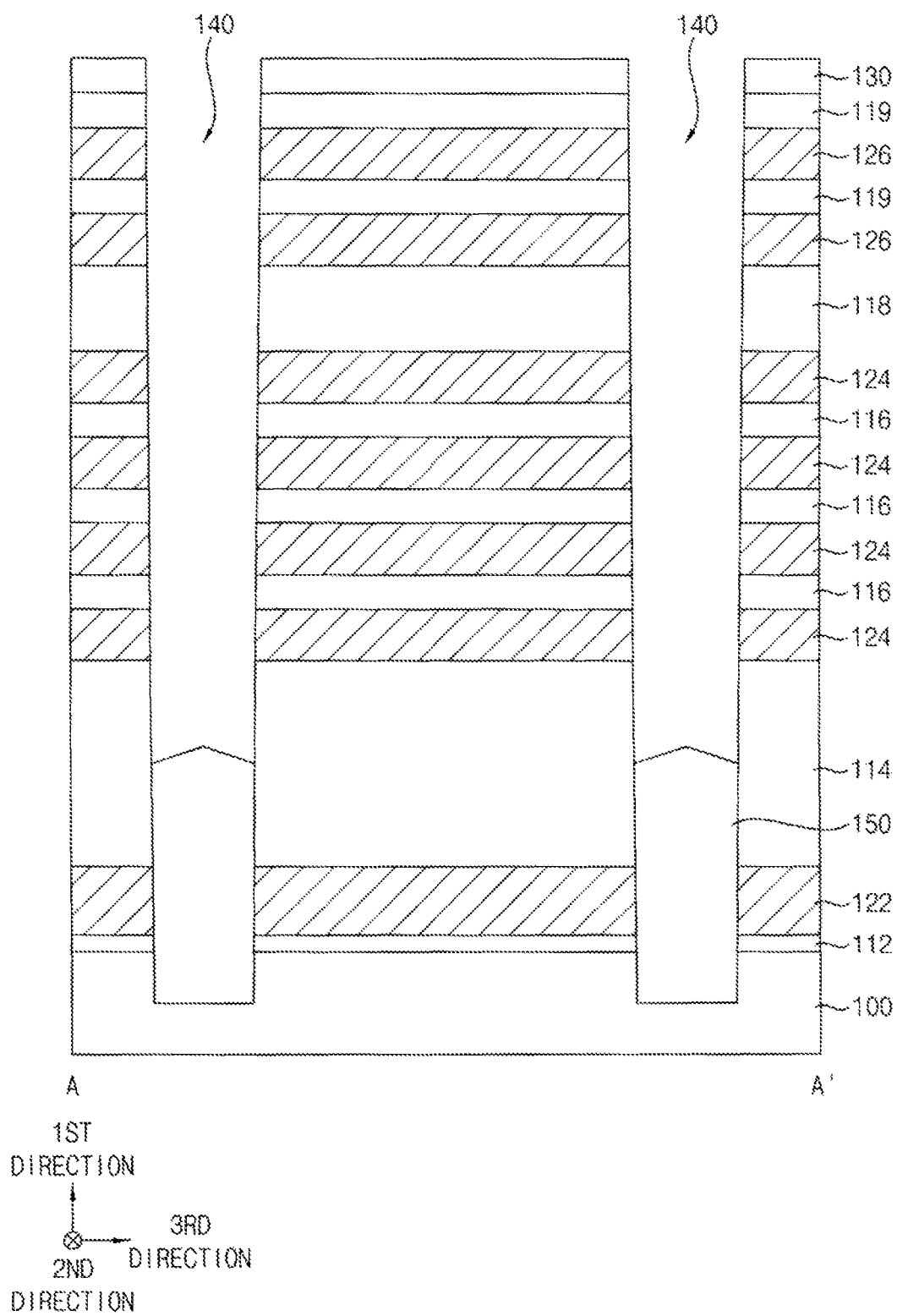

Referring to FIG. 7, the lower channel 150 may be formed to partially fill each of the channel holes 140.

As an example, a selective epitaxial growth (SEG) may be performed using the upper surfaces of the substrate 100 exposed by the channel holes 140 as a seed to form the lower channel 150 partially filling each of the channel holes 140. Thus, the lower channel 150 may include single crystalline silicon, or single crystalline germanium, depending on the material of the substrate 100. In an exemplary embodiment of the present inventive concept, n-type impurities or p-type impurities may be doped into the lower channel 150.

In an exemplary embodiment of the present inventive concept, an upper surface of the lower channel 150 may be formed between an upper surface and a lower surface of the second insulation layer 114. The second insulation layer 114 may have a thickness greater than those of other insulation layers 112, 116, 118 and 119, and thus the lower channel 150 may be formed to have the upper surface between the upper and lower surfaces of the second insulation layer 114.

Figure 8:
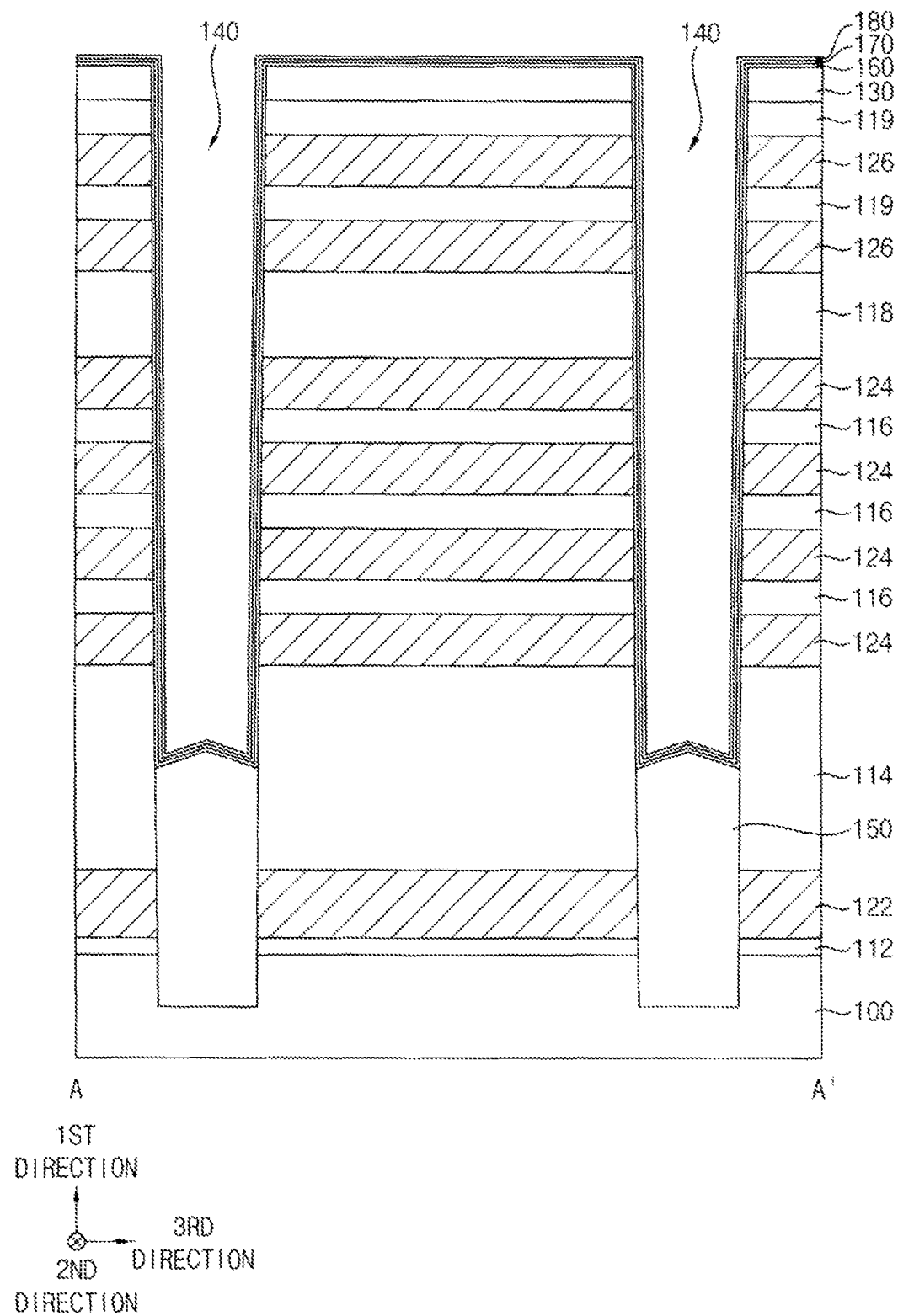

Referring to FIG. 8, a first blocking layer 160, a charge storage layer 170 and a tunnel insulation layer 180 may be sequentially formed on sidewalls of channel holes 140, upper surfaces of the lower channels 150, and an upper surface of the first insulating interlayer 130.

For example, the first blocking layer 160, the charge storage layer 170, and the tunnel insulation layer 180 may include silicon oxide, silicon nitride, and silicon oxide, respectively.

Figure 9:
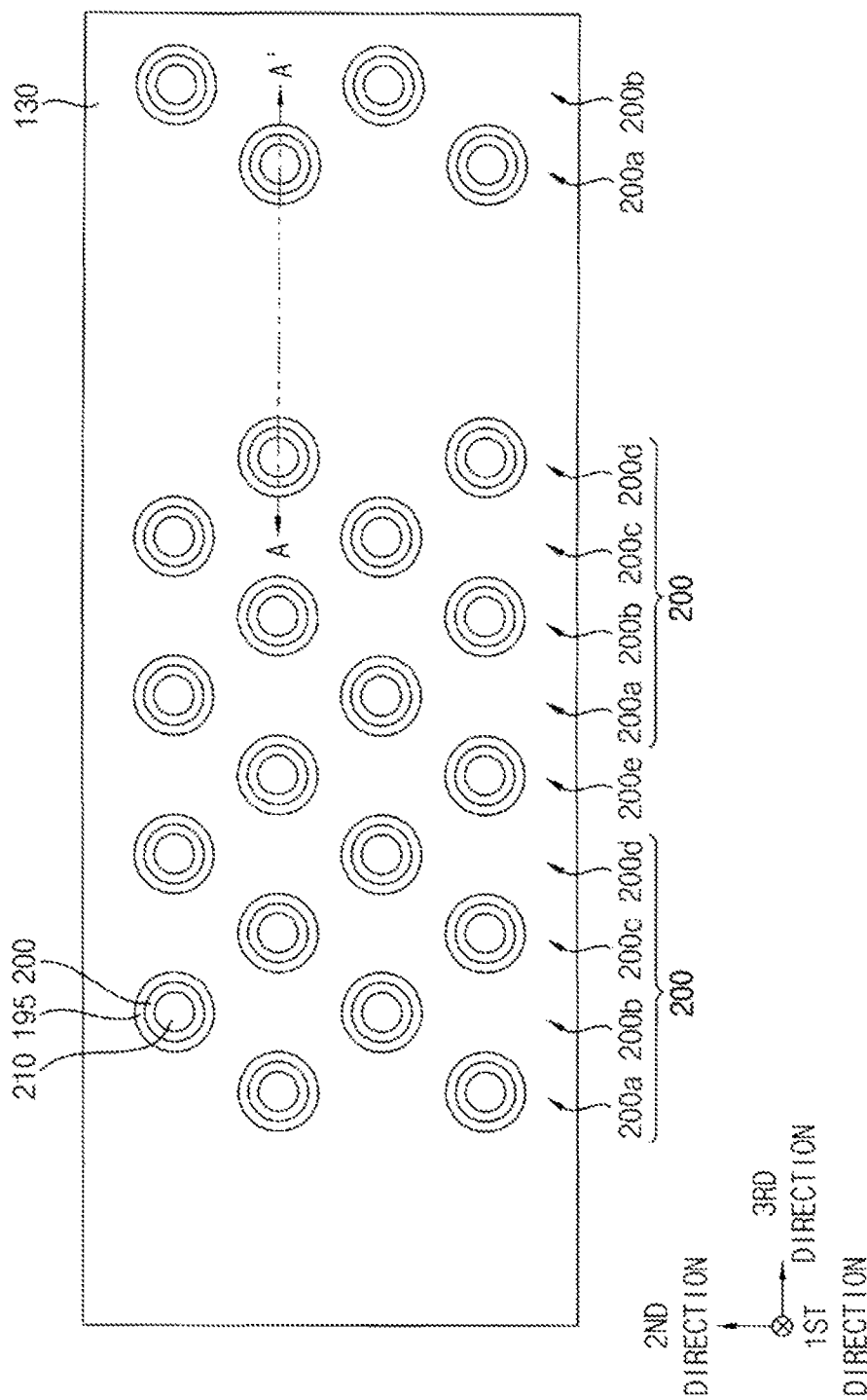
Figure 10:
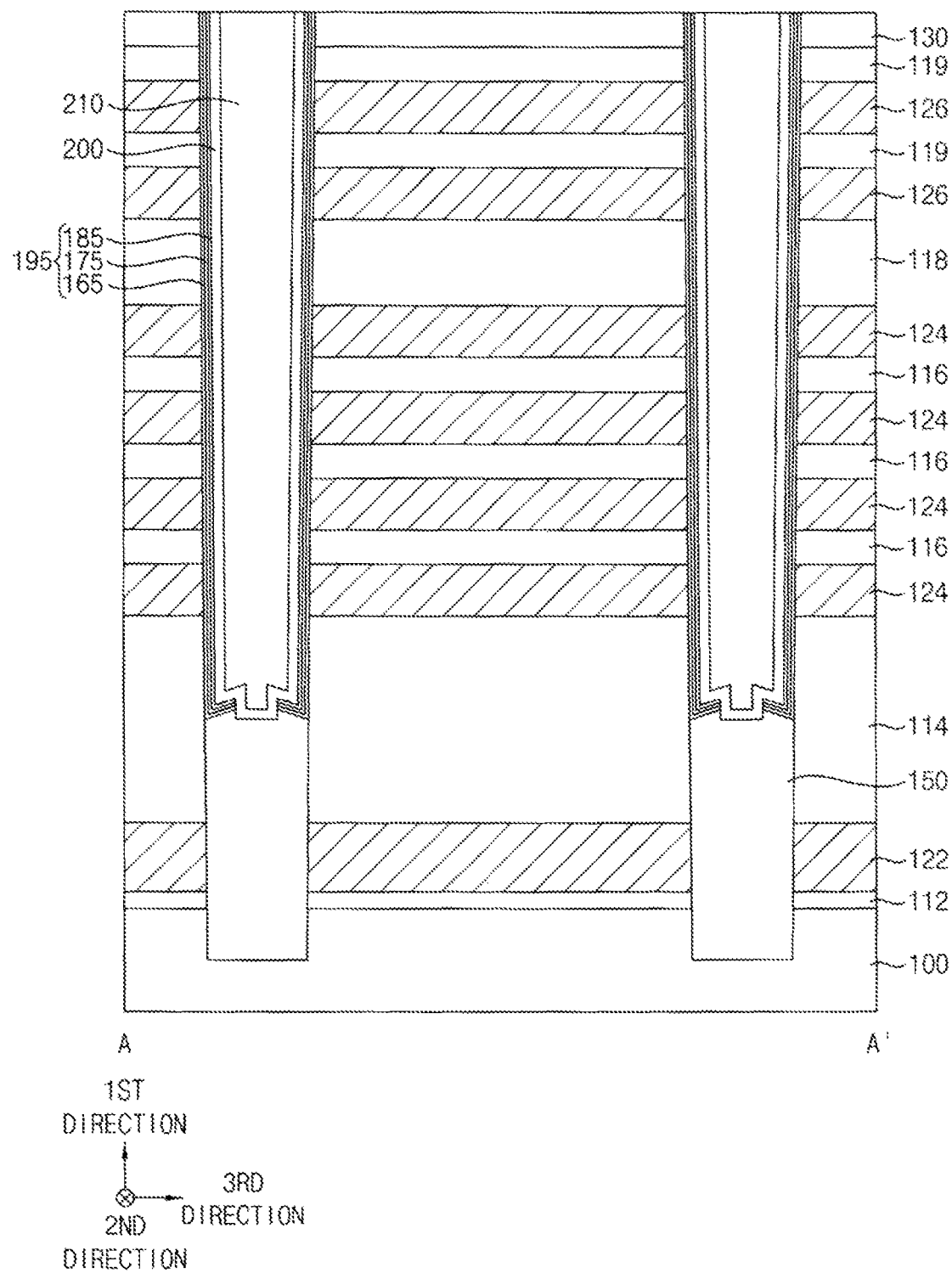

Referring to FIGS. 9 and 10, a first spacer layer may be formed on the tunnel insulation layer 180, and may be anisotropically etched to form a first spacer on the sidewalls of the channel holes 140. The tunnel insulation layer 180, the charge storage layer 170, and the first blocking layer 160 may be etched using the first spacer as an etching mask to form the tunnel insulation pattern 185, the charge storage pattern 175, and the first blocking pattern 165, respectively, on each of the lower channels 150 and on each of the sidewalls of the channel holes 140. Each of the tunnel insulation pattern 185, the charge storage pattern 175 and the first blocking pattern 165 may have a cup-like shape (e.g., a substantially cylindrical shape) of which a bottom is opened. Accordingly, the charge storage structure 195 including the tunnel insulation pattern 185, the charge storage pattern 175 and the first blocking pattern 165 may be formed. During the etching process, an upper portion of each of the lower channels 150 may also be partially removed.

After removing the first spacer, an upper channel layer may be formed on the exposed lower channels 150, the tunnel insulation pattern 185 and the first insulating interlayer 130, and a filling layer may be formed on the upper channel layer to fill remaining portions of the channel holes 140.

The upper channel layer may include polysilicon or amorphous silicon. When the upper channel layer includes amorphous silicon, a laser epitaxial growth (LEG) process or a solid phase epitaxy (SPE) process may be further performed so that amorphous silicon may be transformed into crystalline silicon.

The filling layer and the upper channel layer may be planarized until the upper surface of the first insulating interlayer 140 may be exposed to form the filling pattern 210 filling the remaining portion of each of the channel holes 140, and the upper channel layer may be transformed into an upper channel 200.

Thus, the charge storage structure 195, the upper channel 200 and the filling pattern 210 may be sequentially stacked on the lower channel 150 in each of the channel holes 140.

As the channel holes 140 may form the first to fifth channel hole columns 140a, 140b, 140c, 140d and 140e, the channel hole block, the channel hole group and the channel hole array, the upper channel 200 may also form first to fifth channel columns 200a, 200b, 200c, 200d and 200e, a channel block, a channel group and a channel array.

The lower and upper channels 150 and 200 sequentially stacked on the upper surface of the substrate 100 may form a channel structure, and the channel structure, the charge storage structure 195 surrounding an outer sidewall of the upper channel 200, and the filling pattern 210 filling an inner space formed by the upper channel 200 may form a first structure.

Figure 11:
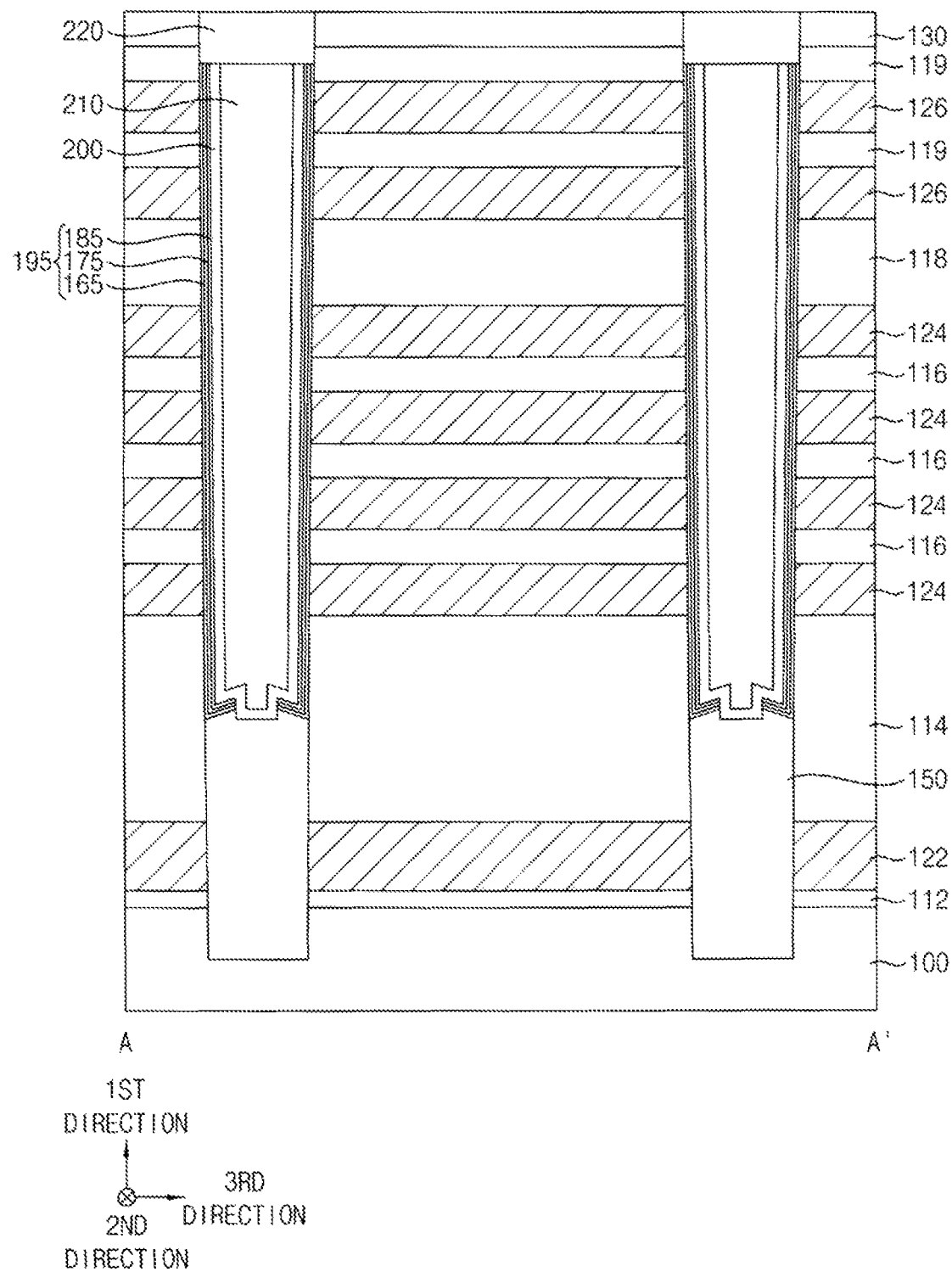

Referring to FIG. 11, an upper portion of the first structure may be removed to form a trench, and the capping pattern 220 may be formed to fill the trench.

In an exemplary embodiment of the present inventive concept, the capping pattern 220 may include doped polysilicon or doped amorphous silicon. When the capping pattern 220 includes amorphous silicon, a crystallization process may be further performed thereon.

Figure 12:
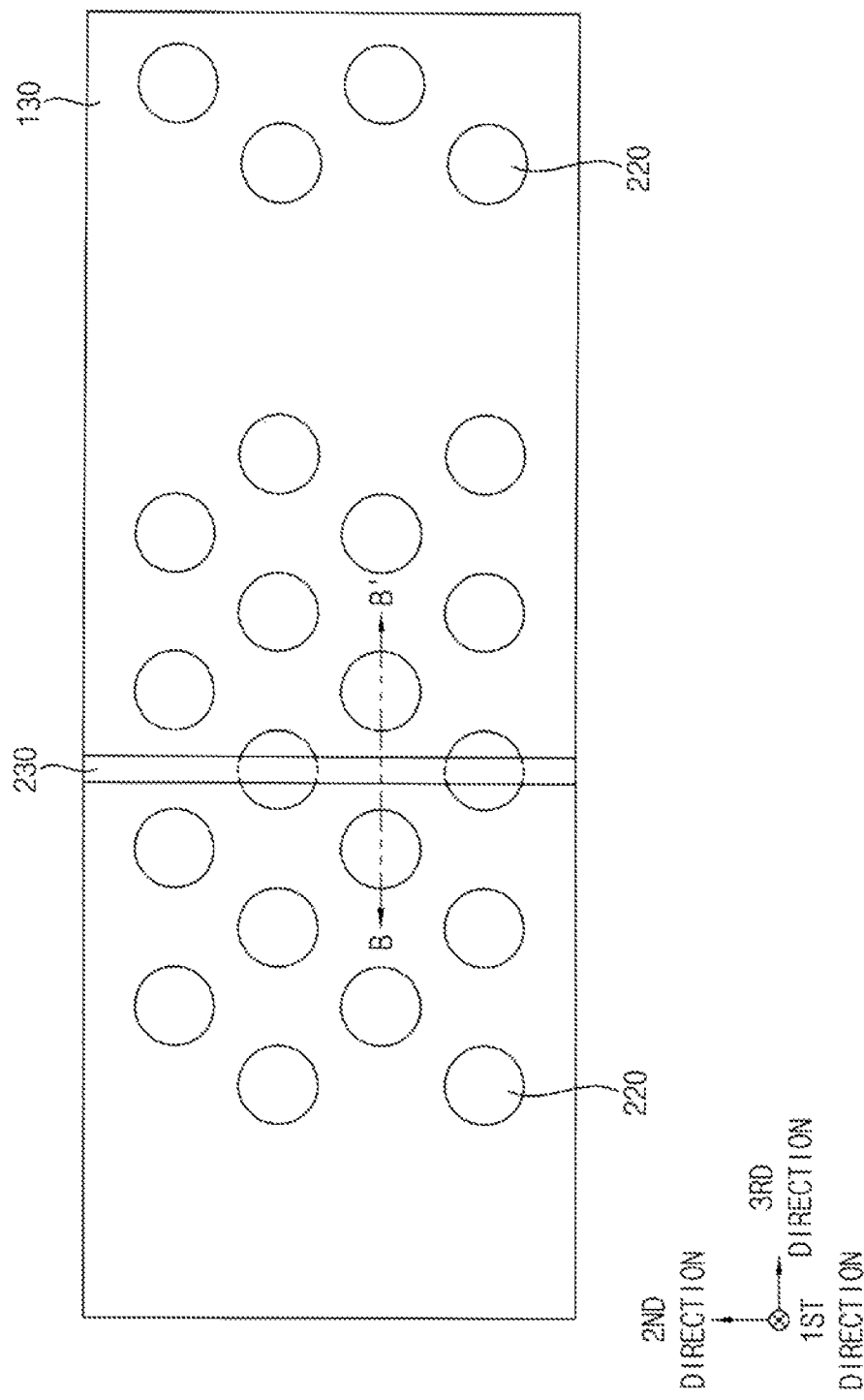
Figure 13:
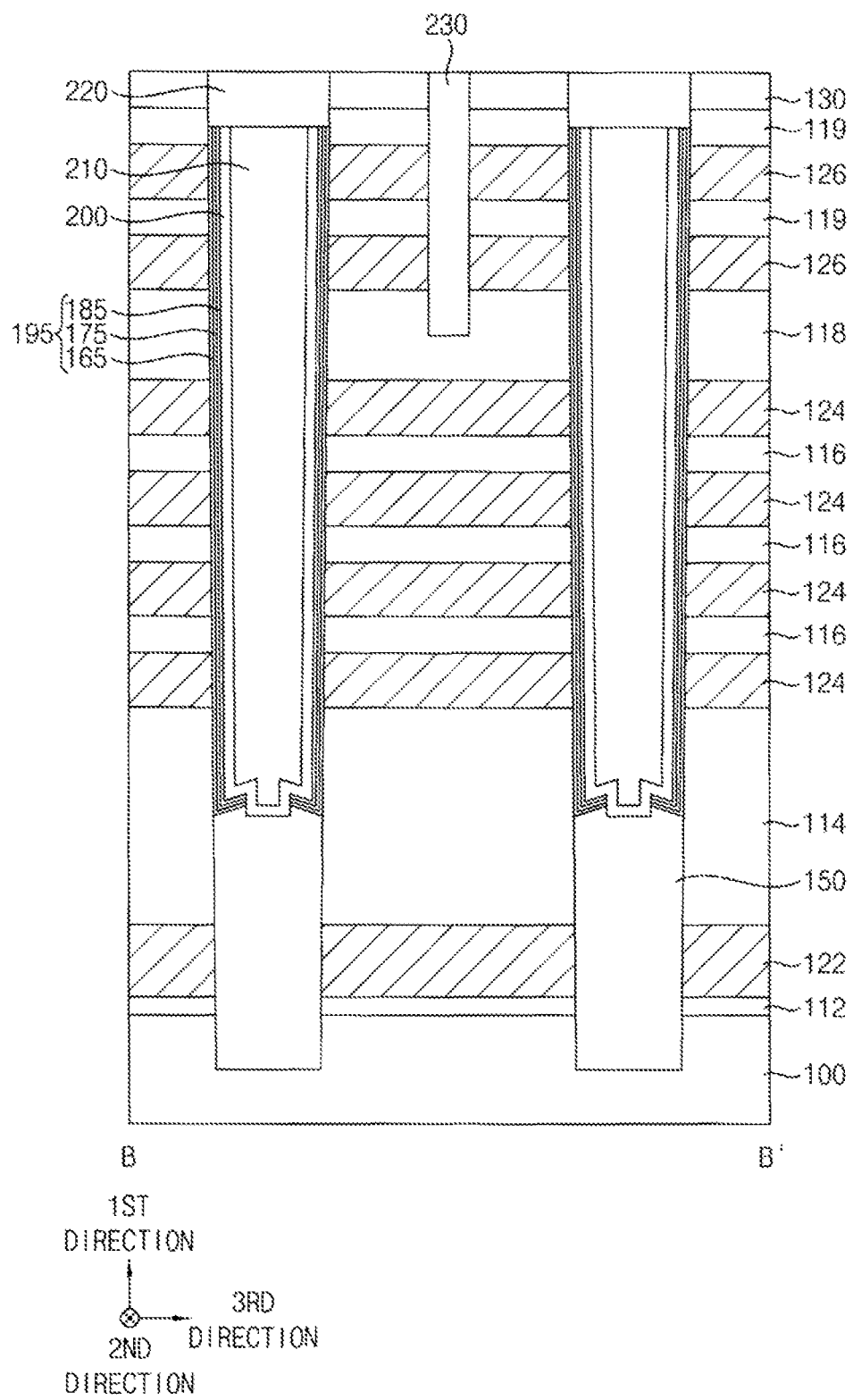

Referring to FIGS. 12 and 13, the division layer 230 may be formed through the first insulating interlayer 130, the third sacrificial layers 126 and the fifth insulation layers 119.

The division layer 230 may be formed by forming an etching mask on the first insulating interlayer 130, etching the first insulating interlayer 130, the third sacrificial layers 126 and the fifth insulation layers 119 to form a first opening therethrough, and fill the first opening with an insulating material. The first opening may also extend through an upper portion of the fourth insulation layer 118. The third sacrificial layers 126 at each level may be spaced apart from each other by the division layer 230.

In an exemplary embodiment of the present inventive concept, the division layer 230 may extend in the second direction between two channel blocks in one channel group, and may extend through upper portions of the channels 200 included in the fifth channel column 200e.

Figure 14:
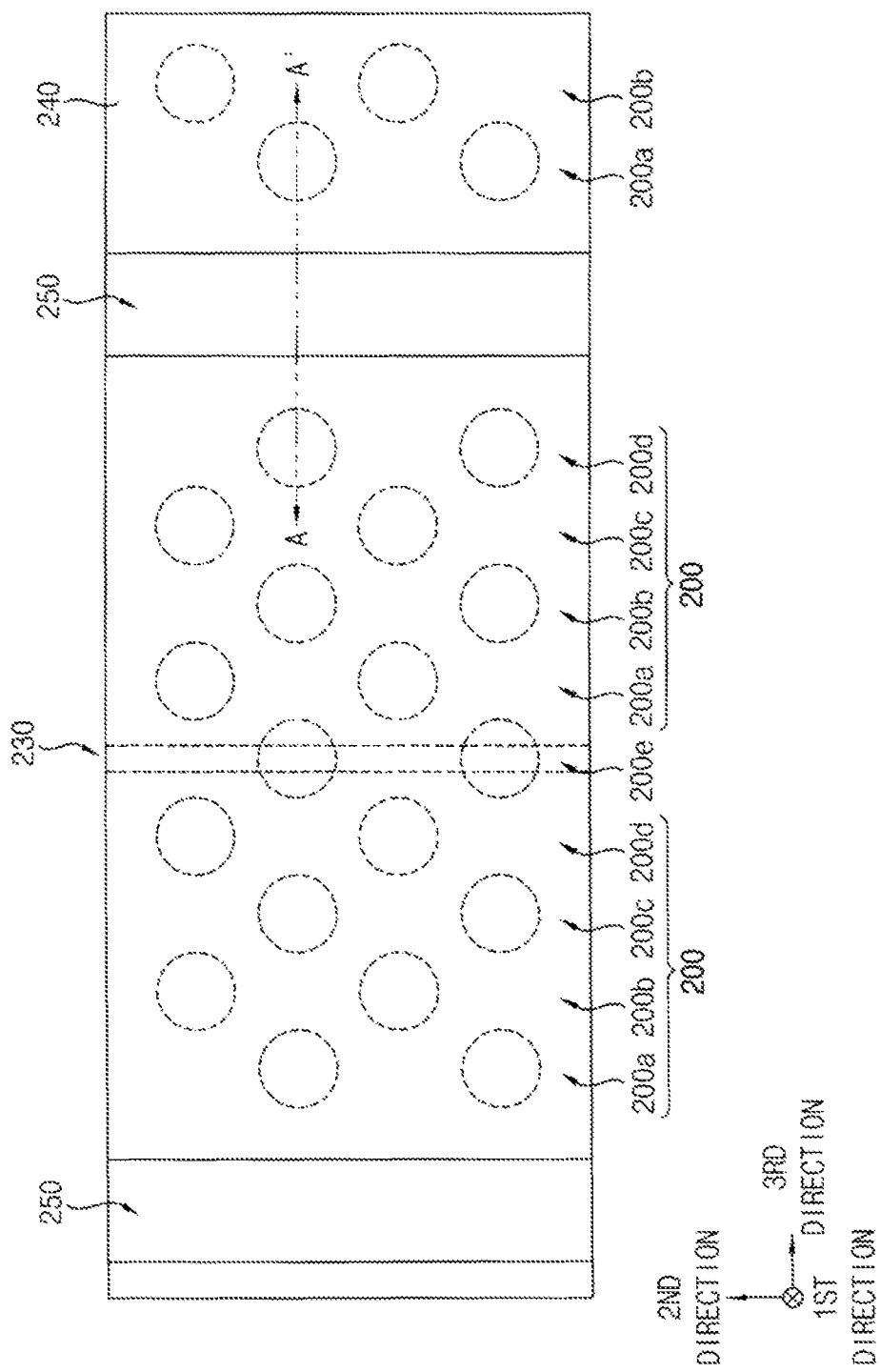
Figure 15:
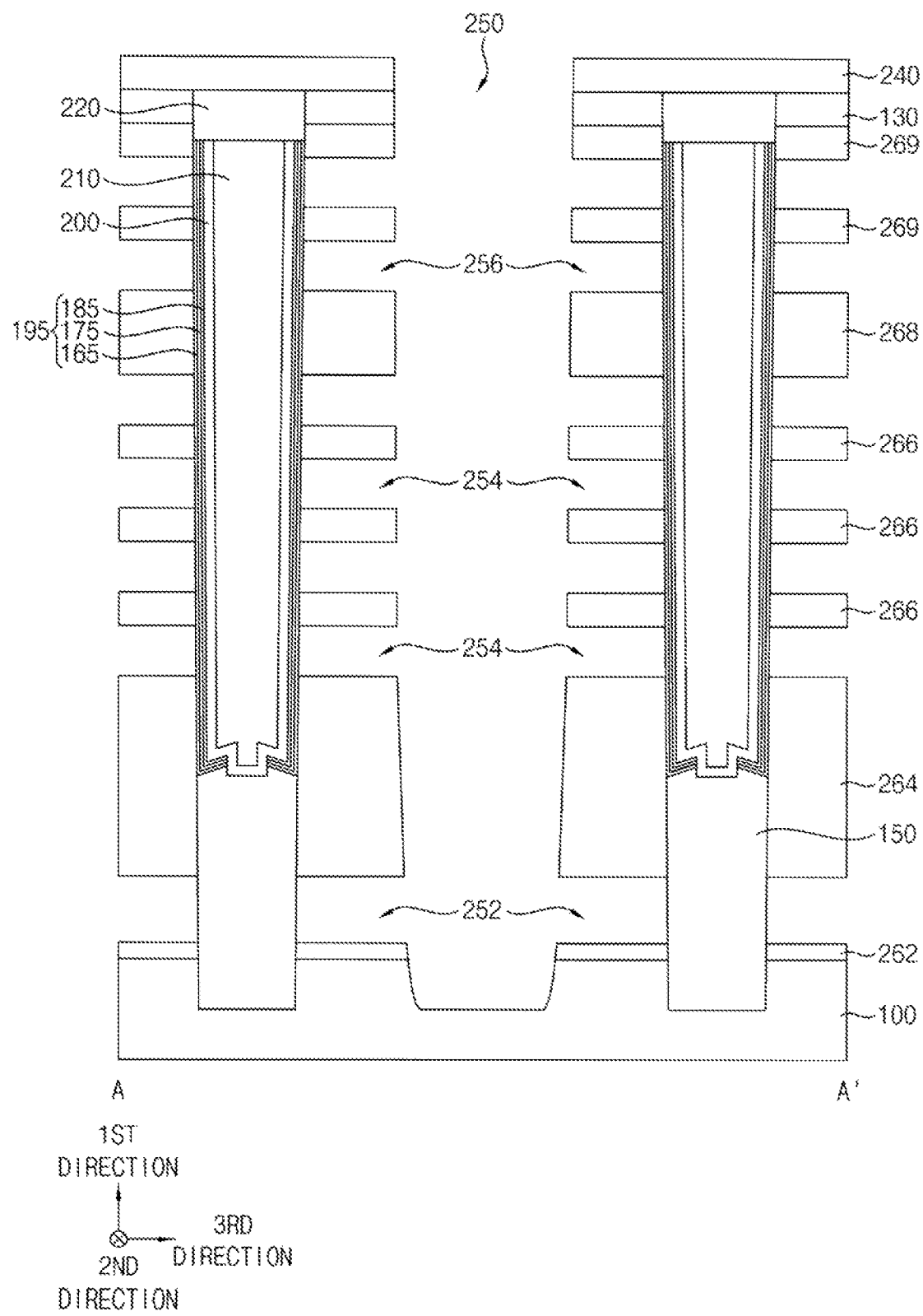

Referring to FIGS. 14 and 15, the second insulating interlayer 240 may be formed on the first insulating interlayer 130, the capping pattern 220 and the division layer 230, and the second opening 250 may be formed through the first and second insulating interlayers 130 and 240, the insulation layers 112, 114, 116, 118 and 119, and the sacrificial layers 122, 124 and 126 to expose an upper surface of the substrate 100. During the formation of the second opening 250, an upper portion of the substrate 100 may be also removed.

In an exemplary embodiment of the present inventive concept, the second opening 250 may extend in the second direction between the channel groups, and a plurality of second openings 250 may be formed in the third direction. As an example, one channel group may be disposed between neighboring ones of the second openings 250 in the third direction, and the channel group may include two channel blocks including four channel columns that may be disposed at opposite sides of the fifth channel column 200e, respectively.

Accordingly, as the second opening 250 is formed, the first to fifth insulation layers 112, 114, 116, 118 and 119 may be transformed into first to fifth insulation patterns 262, 264, 266, 268 and 269, respectively, each of which may extend in the second direction, and an insulation pattern structure may be formed. Additionally, the first to third sacrificial layers 122, 124 and 126 may be transformed into first to third sacrificial patterns, respectively, each of which may extend in the second direction.

In an exemplary embodiment of the present inventive concept, due to the characteristics of etching process, the second opening 250 may have a sidewall not perpendicular to the upper surface of the substrate 100, but slanted with respect to an upper surface of the substrate 100. A slope of the sidewall of the second opening 250 with respect to the upper surface of the substrate 100 may gradually decrease from a top toward a bottom thereof. As an example, a slope of an upper sidewall of the second opening 250 may be about 90 degrees with respect to the upper surface of the substrate 100, while a slope of a lower sidewall of the second opening 250 may be less than 90 degrees with respect to the upper surface of the substrate 100.

The first to third sacrificial patterns exposed by the second opening 250 may be removed to form first, second and third gaps 252, 254 and 256 between the insulation patterns 262, 264, 266, 268 and 269 at respective levels.

In an exemplary embodiment of the present inventive concept, the sacrificial patterns exposed by the second opening 250 may be removed by a wet etching process using an etchant including, e.g., phosphoric acid or sulfuric acid.

A portion of a sidewall of the lower channel 150 may be exposed by the first gap 252, and portions of an outer sidewall of the first blocking pattern 165 may be exposed by the second and third gaps 254 and 256.

Figure 16:
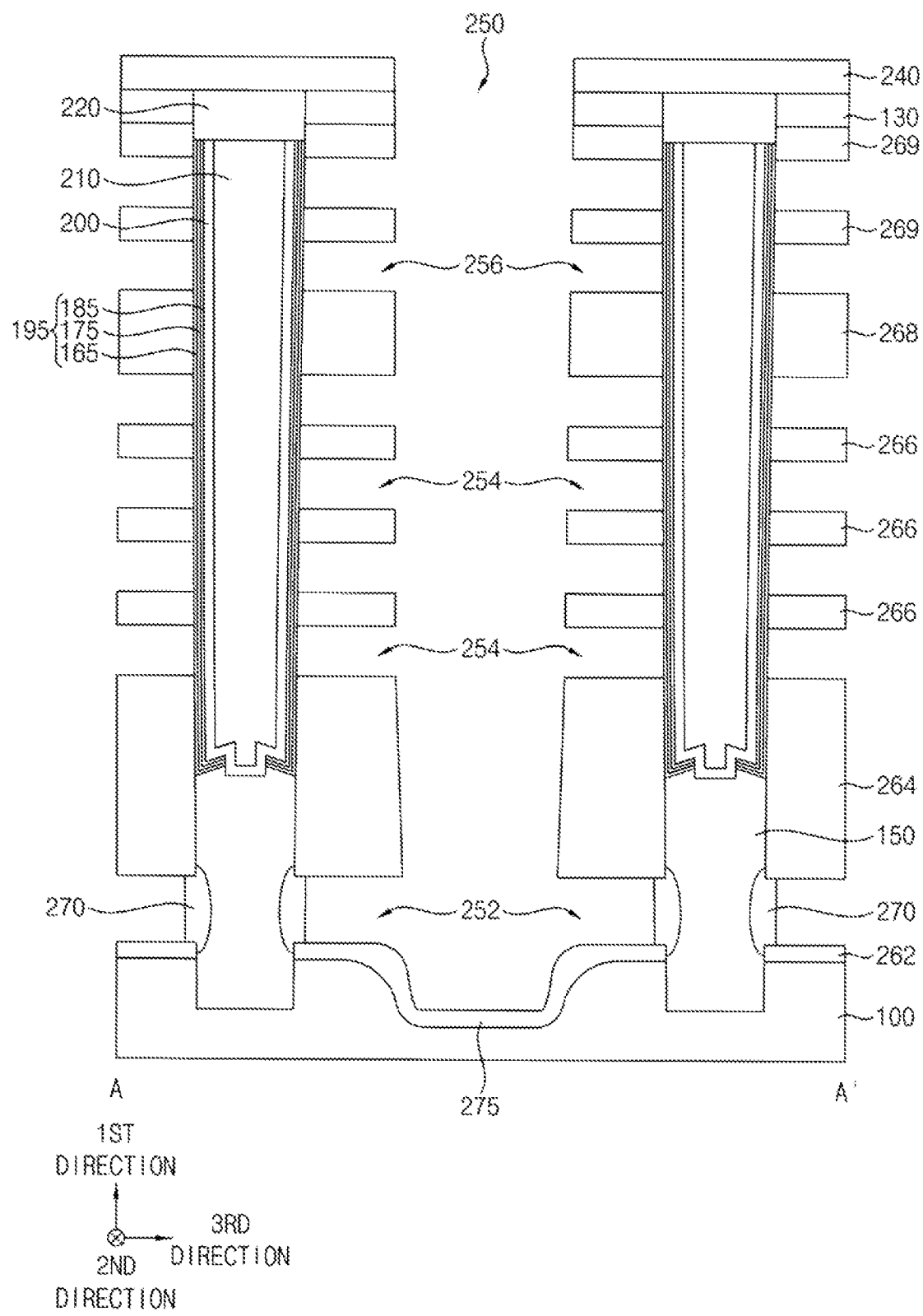

Referring to FIG. 16, the exposed portion of the sidewall of the lower channel 150 may be oxidized to form the first gate insulation pattern 270. The first gate insulation pattern 270 may completely cover the exposed portion of the sidewall of the lower channel 150. The first gate insulation pattern 270 may additionally extend onto a portion of a sidewall of the second insulation pattern 264.

In an exemplary embodiment of the present inventive concept, a wet oxidation process may be performed by providing water vapor onto the substrate 100 so that the exposed portion of the sidewall of the lower channel 150 including a semiconductor material and exposed by the first gap 252 may be oxidized to form the first gate insulation pattern 270. Alternatively, a dry oxidation process may be performed by providing oxygen onto the substrate 100 to form the first gate insulation pattern 270. The lower channel 150 may include, e.g., silicon, and thus the exposed portion of the sidewall of the lower channel 150 may be transformed into a silicon oxide layer.

Accordingly, a recess may be formed on the sidewall of the lower channel 150 having a pillar shape to horizontally surround the sidewall thereof, and the first gate insulation pattern 270 may fill the recess. The first gate insulation pattern 270 may protrude horizontally from the sidewall of the lower channel 150, and may have a ring shape. As an example, a side of the first gate insulation pattern 270 facing the first gate electrode 332 may be substantially flat along the first direction, while a side of the first gate insulation pattern 270 facing away from the first gate electrode 332 may be curved.

During the oxidation process, the upper surface of the substrate 100 exposed by the second opening 250 may be also oxidized to form the second gate insulation pattern 275. The substrate 100 may include, e.g., silicon, and thus the exposed upper surface of the substrate 100 may be transformed into a silicon oxide layer, which may be merged with the first insulation pattern 262.

However, not all portions of the first insulation pattern 262 on the upper surface of the substrate 100 may be merged with the second gate insulation pattern 275. As an example, water vapor and/or oxygen might not be provided into a portion of the upper surface of the substrate 100 distant from the second opening 250, and thus the first insulation pattern 262 may keep the original size.

Herein, the first insulation pattern 262 on the upper surface of the substrate 100 and the second gate insulation pattern 275 merged therewith may be referred to as the second gate insulation pattern 275.

Figure 17:
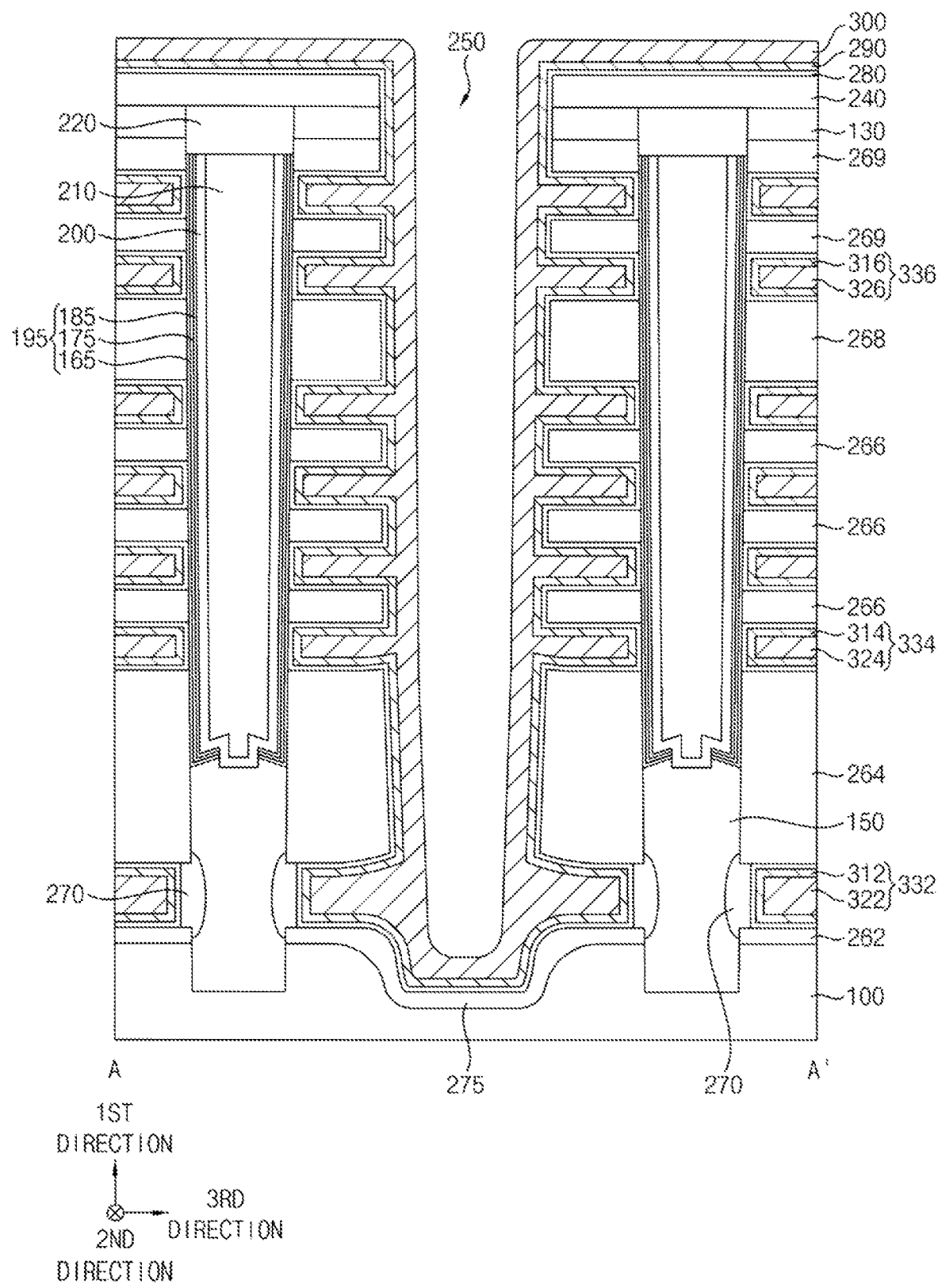

Referring to FIG. 17, after the second blocking layer 280 may be formed on the exposed portions of the outer sidewall of the first blocking pattern 165, a sidewall of the first gate insulation pattern 270, inner walls of the first to third gaps 252, 254 and 256, surfaces of the first to fifth insulation patterns 262, 264, 266, 268 and 269, an upper surface of the second gate insulation pattern 275, and an upper surface of the second insulating interlayer 240. A gate barrier layer 290 may be formed on the second blocking layer 280. A gate conductive layer 300 may be formed on the gate barrier layer 290 to fill remaining portions of the first to third gaps 252, 254 and 256.

In an exemplary embodiment of the present inventive concept, the second blocking layer 280 may include a metal oxide, e.g., aluminum oxide, hafnium oxide, or zirconium oxide, the gate barrier layer 290 may include a metal nitride, e.g., titanium nitride, or tantalum nitride, and the gate conductive layer 300 may include a metal having a relatively low resistance, e.g., tungsten, titanium, or tantalum. Thus, the second blocking layer 280, the gate barrier layer 290 and the gate conductive layer 300 may include different materials from each other, and thus may be formed by independent deposition processes.

In an exemplary embodiment of the present inventive concept, when the deposition process for forming the second blocking layer 280 is performed, each of opposite ends of the second insulation pattern 264 in the third direction (e.g., each portion of the second insulation pattern 264 adjacent the second opening 250) may be bent in a direction away from the upper surface of the substrate 100. For example, upper and lower surfaces of the second insulation pattern 264 may be bent away from an upper surface of the substrate 100 along the first direction.

A lower sidewall of the second opening 250 may have a slope less than that of an upper sidewall of the second opening 250, and the second insulation pattern 264 adjacent the lower sidewall of the second opening 250 may have a relatively thick thickness in the first direction. Thus, a length difference in the third direction between a lower surface and an upper surface of the second insulation pattern 264 may be relatively high, and the second blocking layer 280 may apply a different amount of stress on a surface of the second insulation pattern 264 during the deposition thereof.

As an example, an upper portion of the second insulation pattern 264 may be in direct contact with the charge storage structure 195, while a lower portion of the second insulation pattern 264 may be in direct contact with the first gate insulation pattern 270 including the same material, e.g., silicon oxide as the second insulation pattern 264. Thus, the length difference of the lower and upper surfaces of the second insulation pattern 264 may be increased, so that the amount of stress applied by the second blocking layer 280 onto the lower and upper surfaces of the second insulation pattern 264 may be increased.

Accordingly, after forming the second blocking layer 280, the length difference between the lower and upper surfaces of the second insulation pattern 264 may increase, and the slope of the sidewall of the second insulation pattern 264 adjacent the second opening 250 may decrease.

In addition to the deposition process for forming the second blocking layer 280, the above described application of stress may similarly occur in the deposition process for forming the gate barrier layer 290 as a result of the shape of the second insulation pattern 264.

As a result, during the deposition process for forming the gate conductive layer 300, the lower surface of the second insulation pattern 264 has been already bent upwardly, an inlet of the first gap 252 between a bottom surface of the second insulation pattern 264 and the upper surface of the substrate 100 (e.g., an outer portion of the first gap 252 adjacent the second opening 250) may have a width in the first direction greater than that of an inner portion of the first gap 252. Thus, even if the first gap 252 is formed under the second and third gaps 254 and 256, a source gas may be easily provided into the first gap 252 during the deposition process for forming the gate conductive layer 300, so that the gate conductive layer 300 may be filled into the first gap 252 well. Thus, the first gate electrode 332 may be more reliably formed with a reduced failure or defect rate in the first gate electrode 332.

Figure 18:
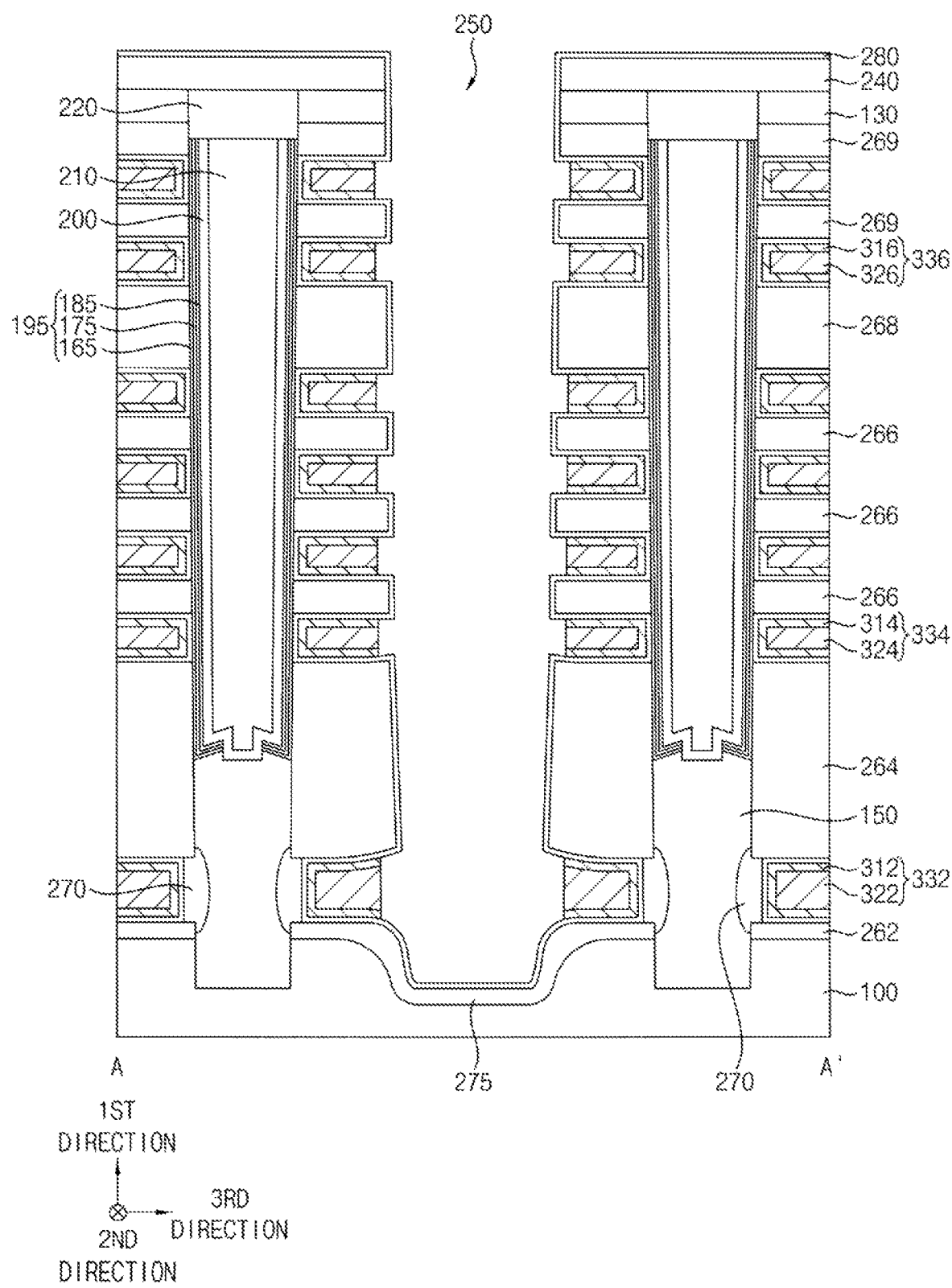

Referring to FIG. 18, the gate conductive layer 300 and the gate barrier layer 290 may be partially removed to form a gate conductive pattern and a gate barrier pattern, respectively, in each of the first to third gaps 252, 254 and 256, which may form a gate electrode. In an exemplary embodiment of the present inventive concept, the gate conductive layer 300 and the gate barrier layer 290 may be partially removed by a wet etching process, and thus the gate electrode may fill a portion of each of the first to third gaps 252, 254 and 256.

As an example, the gate electrodes may fill other portions of each of the first to third gaps 252, 254 and 256 except for an inlet thereof. Thus, a thickness in the first direction of the gate electrode filling the first gap 252 may change according to a length of the gate electrode in the third direction filling the first to third gaps 252, 254 and 256.

The inlet of the first gap 252 is enlarged to have the width in the first direction greater than that of the inner portion of the first gap 252, and thus, when a relatively small amount of the gate conductive layer 300 and the gate barrier layer 290 filling the first gap 252 is removed to form the gate electrode, a thickness of a sidewall of the gate electrode in the first direction adjacent to the inlet of the first gap 252 may be greater than that of a central portion of the gate electrode spaced apart from the inlet of the gap 252 in the third direction. However, when a large amount of the gate conductive layer 300 and the gate barrier layer 290 filling the first gap 252 is removed to form the gate electrode, the thickness of the sidewall of the gate electrode in the first direction may be substantially the same as that of the central portion of the gate electrode in the first direction.

The gate electrode may extend in the second direction, and a plurality of gate electrodes may be formed in the third direction. Thus, the gate electrodes extending in the second direction may be spaced apart from each other by the second opening 250.

In an exemplary embodiment of the present inventive concept, the gate electrodes may be formed at a plurality of levels, respectively, spaced apart from each other in the first direction, and may form a gate electrode structure. The gate electrode structure may include at least one first gate electrode 332, a plurality of second gate electrodes 334, and at least one third gate electrode 336 sequentially stacked. The number of levels at which each of the first to third gate electrodes 332, 334 and 336 are formed may be changed according to the number of levels at which each of the first to third sacrificial layers 122, 124 and 126 may be formed.

The first gate electrode 332 serving as a GSL may face the first gate insulation pattern 270 on the sidewall of the lower channel 150, the second and third gate electrodes 334 and 336 serving as a word line and an SSL, respectively, may face a sidewall of the charge storage structure 195 on the outer sidewall of the upper channel 200.

Accordingly, the first gate insulation pattern 270, the second blocking layer 280 and the first gate electrode 332 may be sequentially stacked on the sidewall of the lower channel 150 in a horizontal direction (e.g. along the third direction), and the tunnel insulation pattern 185, the charge storage pattern 175, the first blocking pattern 165, the second blocking layer 280 and the second gate electrode 334 or the third gate electrode 336 may be sequentially stacked on the outer sidewall of the upper channel 200 in the horizontal direction (e.g. along the third direction).

Figure 19:
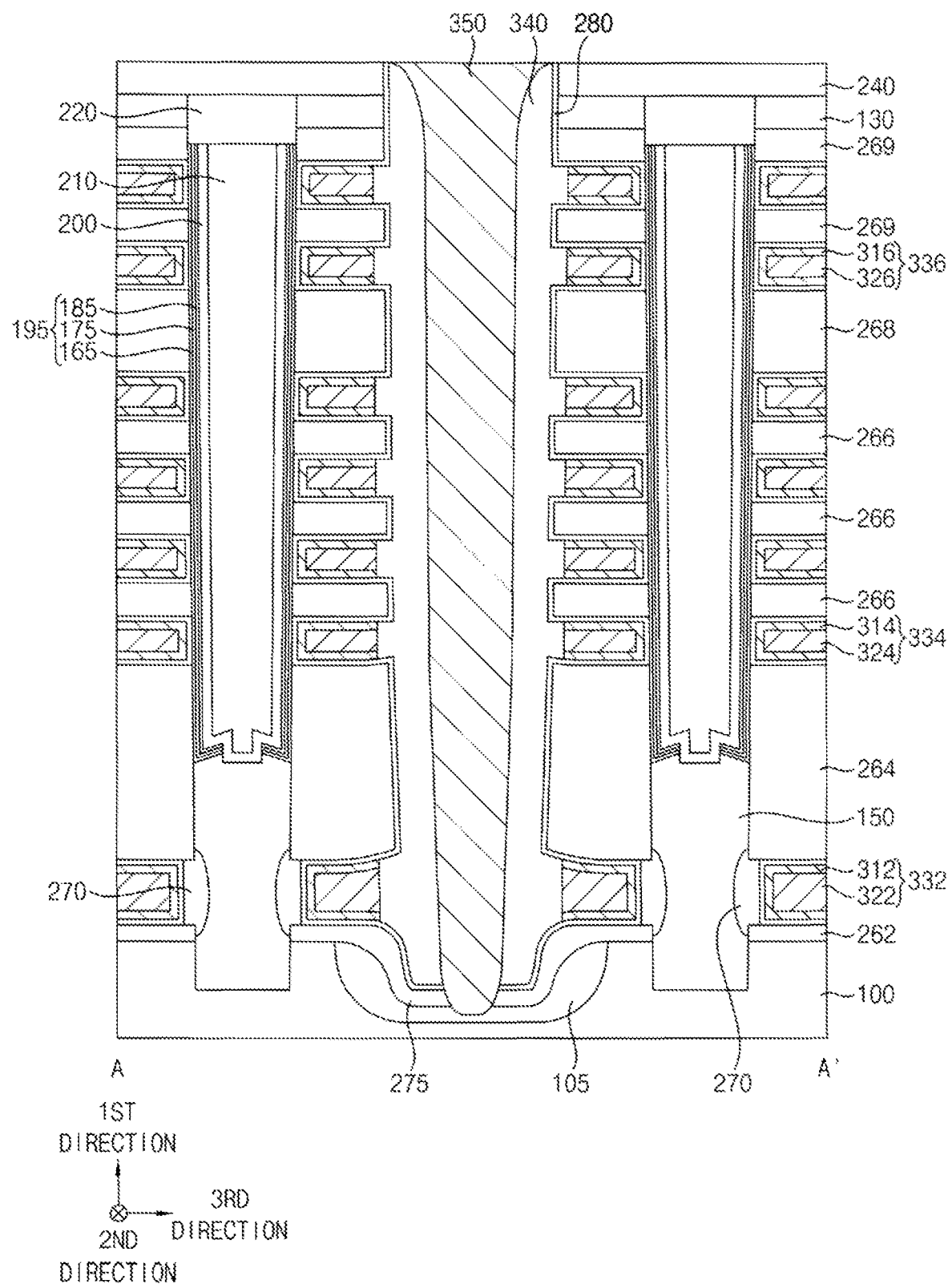

Referring to FIG. 19, impurities may be implanted through the second blocking layer 280 and the second gate insulation pattern 275 thereunder, which may be exposed by partially removing the gate conductive layer 300 and the gate barrier layer 290, into an upper portion of the substrate 100 to form the impurity region 105. In an exemplary embodiment of the present inventive concept, the impurities may include n-type impurities, e.g., phosphorus, or arsenic.

A second spacer layer may be formed on the second blocking layer 280, and may be anisotropically etched to form the second spacer 340 on the sidewall of the second opening 250, and a portion of the second blocking layer 280 on the impurity region 105 may be exposed.

A portion of the second blocking layer 280 not covered by the second spacer 340 and a portion of the second gate insulation pattern 275 thereunder may be etched, and a portion of the second blocking layer 280 on the upper surface of the second insulating interlayer 240 may be also removed. Thus, the second gate insulation pattern 275 may be divided into a plurality of pieces spaced apart from each other in the third direction, and each piece of the second gate insulation pattern 275 may extend in the second direction. A portion of the impurity region 105 at an upper portion of the substrate 100 may be also removed.

A conductive layer may be formed on impurity region 105, the second spacer 340 and the second insulating interlayer 240 to fill a remaining portion of the opening second 250, and may be planarized until the upper surface of the second insulating interlayer 240 may be exposed to form a CSL 350.

In an exemplary embodiment of the present inventive concept, the CSL 350 may extend in the first direction, and may also extend in the second direction. A lower portion of the CSL 350 may be in direct contact with the second gate insulation pattern 275, and a bottom of the CSL 350 may be surrounded by the impurity region 105.

Referring to FIGS. 1, 2A, 2B and 3 again, the third insulating interlayer 360 may be formed on the second insulating interlayer 240, the CSL 350, the second spacer 340 and the second blocking layer 280, and the contact plug 370 may be formed through the second and third insulating interlayers 240 and 360 to be in direct contact with the capping pattern 220. The fourth insulating interlayer 380 may be formed on the third insulating interlayer 360 and the contact plug 370, and the bit line 390 may be formed through the fourth insulating interlayer 380 to be in direct contact with the contact plug 370.

In an exemplary embodiment of the present inventive concept, the bit line 390 may extend in the third direction, and a plurality of bit lines 390 may be formed in the second direction.

By the above processes, the vertical memory device according to an exemplary embodiment of the present inventive concept may be manufactured.

The lower and upper surfaces of the second insulation pattern 264 may be bent upwardly in the first direction, and thus the inlet of the first gap 252 for forming the GSL may be enlarged. Accordingly, even if the first gap 252 is formed under the second and third gaps 254 and 256, the source gas may be easily provided into the first gap 252 to form the GSL well.

Figure 20:
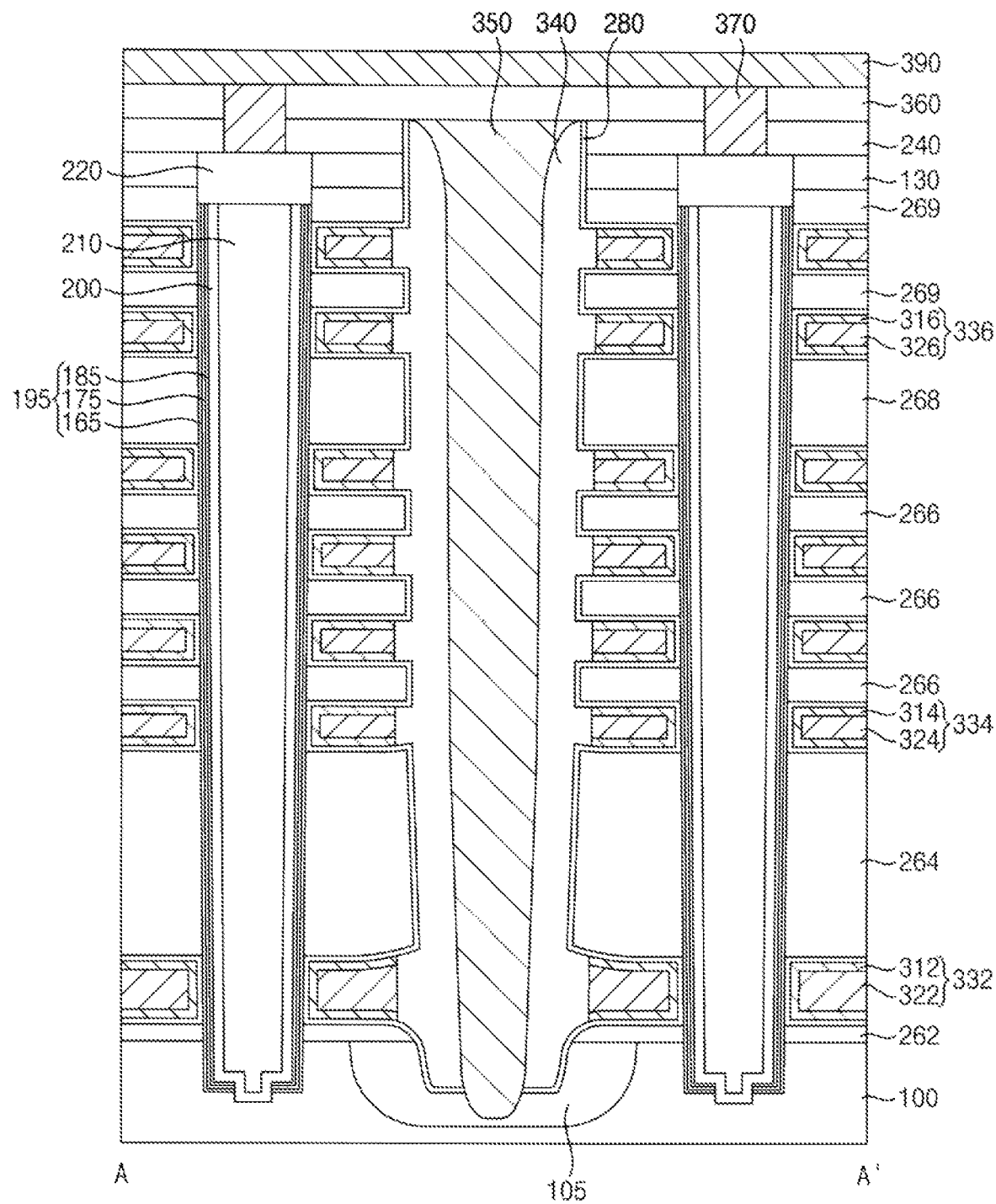
FIG. 20 is a cross-sectional view illustrating a vertical memory device in accordance with an exemplary embodiment of the present inventive concept.

FIG. 20 is a cross-sectional view illustrating a vertical memory device in accordance with an exemplary embodiment of the present inventive concept. Particularly, FIG. 20 is a cross-sectional view taken along a line of A-A' of FIG. 1.

The vertical memory device described below with reference to FIG. 20 may be substantially the same as that described with reference to FIGS. 1, 2A, 2B and 3, except for the first structure and the first and second gate insulation patterns. Thus, like reference numerals may refer to like elements below, and duplicative descriptions may be omitted below.

Referring to FIG. 20, the vertical memory device need not include the lower channel 150, and thus the first and second gate insulation patterns 270 and 275 need not be formed.

The lower channel 150 is not formed, and thus the upper channel 200 may directly contact the upper surface of the substrate 100, and the charge storage structure 195 surrounding the outer sidewall of the upper channel 200 and the filling pattern 210 for filling the inner space formed by the upper channel 200 may also extend to the upper surface of the substrate 100.

Figure 21:
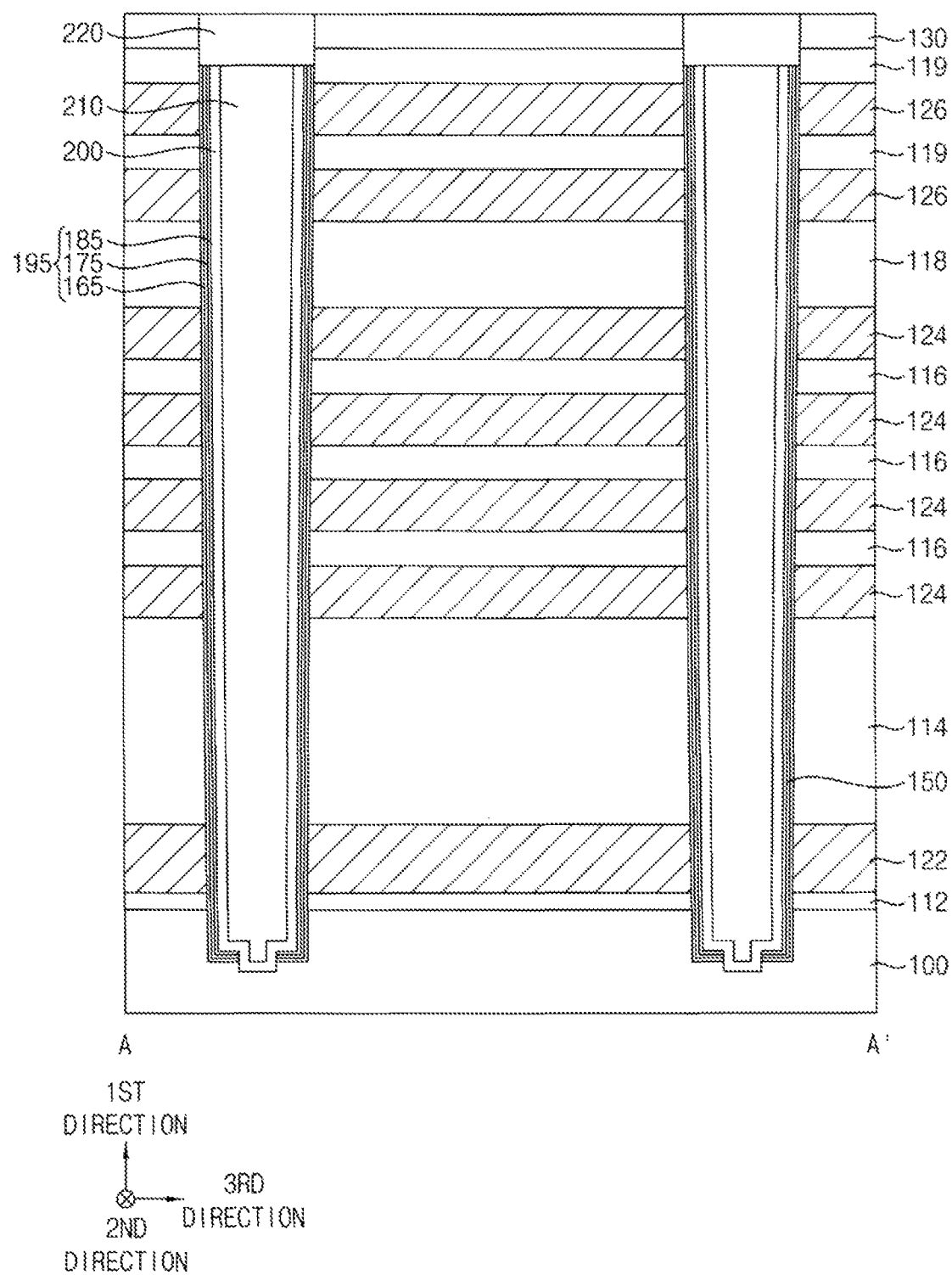
FIGS. 21 and 22 are cross-sectional views illustrating a method of manufacturing the semiconductor device of FIG. 20.
Figure 22:
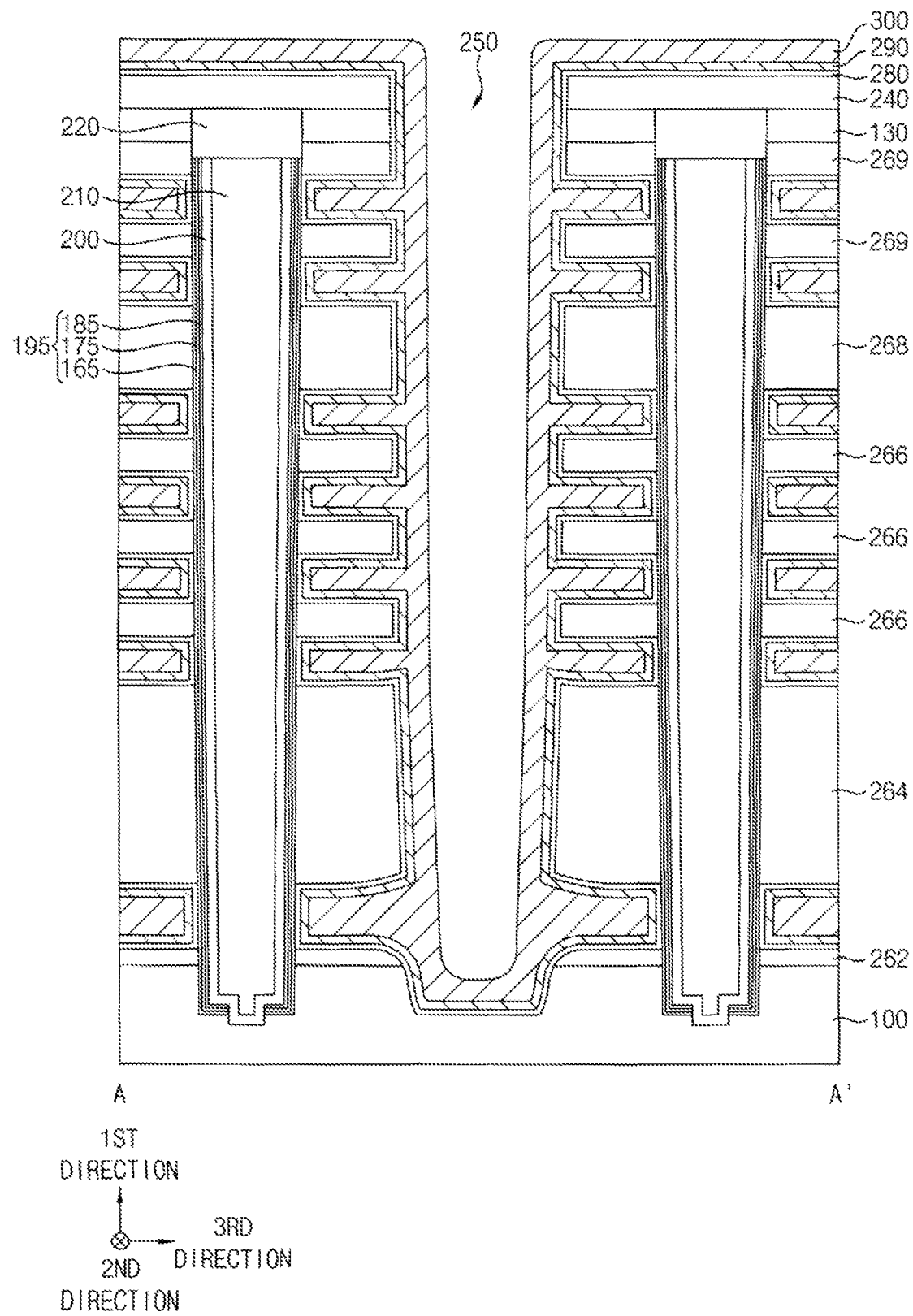

FIGS. 21 and 22 are cross-sectional views illustrating a method of manufacturing the semiconductor device of FIG. 20. This method may include processes substantially the same as or similar to those described above with reference to FIGS. 4 to 19, and thus duplicative descriptions may be omitted below.

Referring to FIG. 21, processes substantially the same as or similar to those described above with reference to FIGS.

4 to 6 may be performed, and processes substantially the same as or similar to those described above with reference to FIG. 8 may be performed.

Thus, the lower channel 150 might not be formed on the upper surface of the substrate 100 because the processes described above with reference to FIG. 7 are not performed.

Referring to FIG. 22, processes substantially the same as or similar to those described above with reference to FIGS. 9 to 17 may be performed.

The lower surface of the second insulation pattern 264 may be bent upwardly in the first direction, and thus the inlet of the first gap 252 may be enlarged and the source gas for forming the gate conductive layer may be easily provided into the first gap 252.

Referring to FIG. 20 again, processes substantially the same as or similar to those described above with reference to FIGS. 18 to 19, and FIGS. 1, 2A, 2B and 3 may be performed to complete the fabrication of the vertical memory device.

Figure 23A:
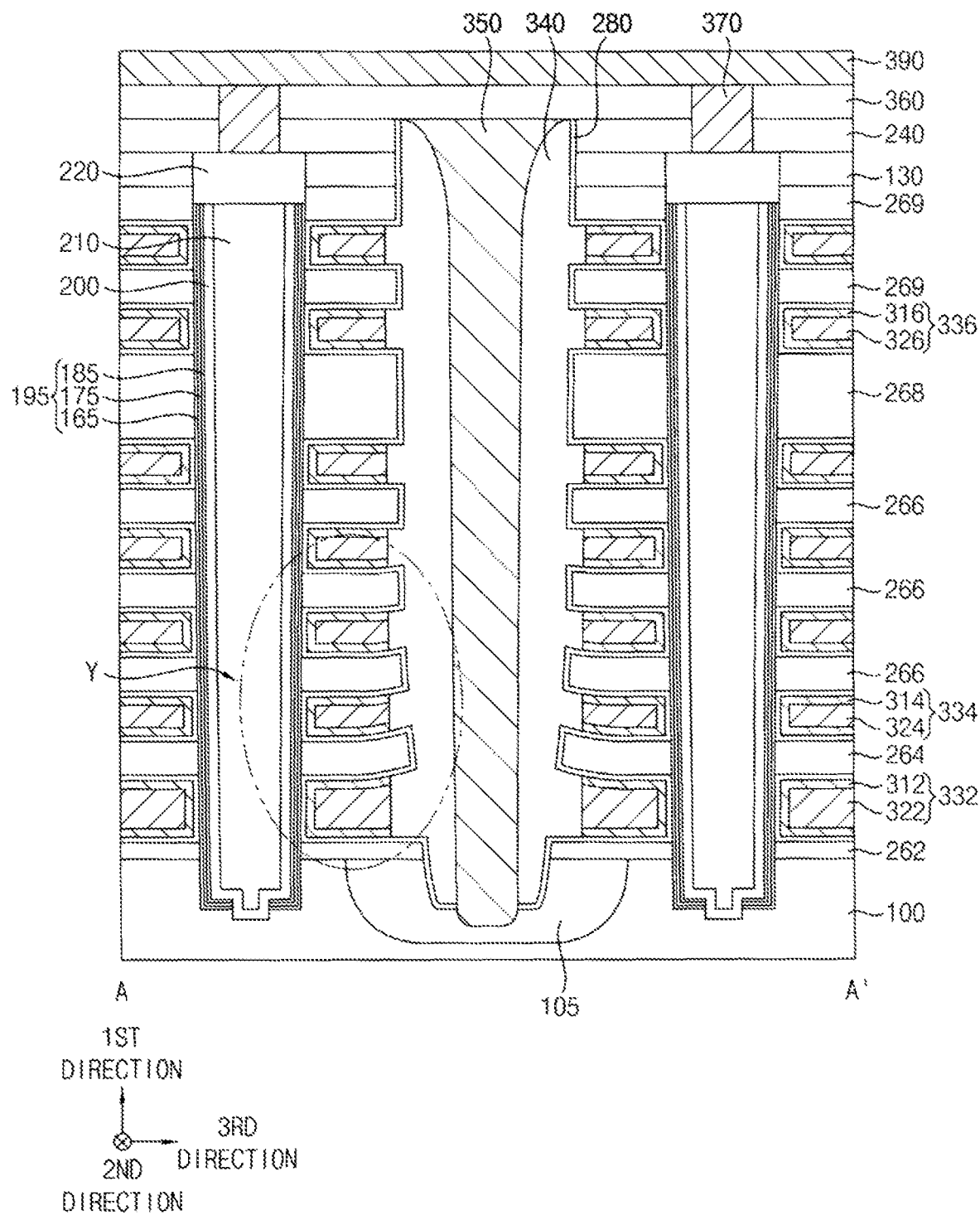
FIGS. 23A and 23B are cross-sectional view illustrating a vertical memory device in accordance with an exemplary embodiment of the present inventive concept.
Figure 23B:
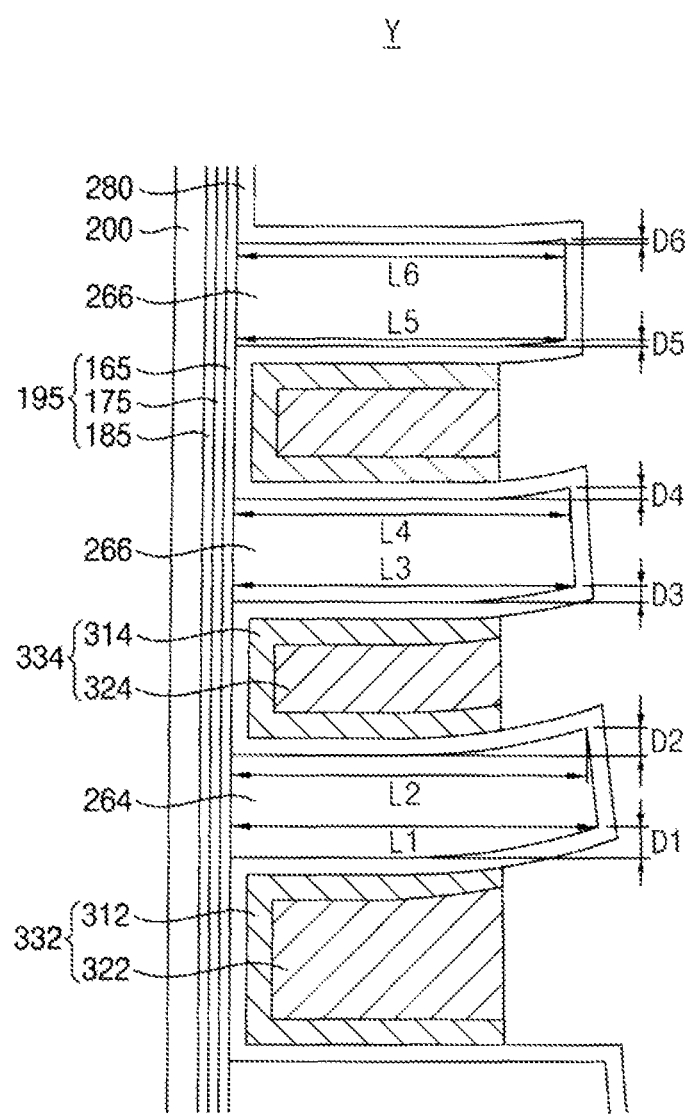

FIGS. 23A and 23B are cross-sectional view illustrating a vertical memory device in accordance with an exemplary embodiment of the present inventive concept. Particularly, FIG. 23A is a cross-sectional view taken along a line of A-A' of FIG. 1, and FIG. 23B is an enlarged cross-sectional view of a region Y of FIG. 23A.

The vertical memory device described below with reference to FIGS. 23A and 23B may be substantially the same as that described above with reference to FIGS. 1, 2A, 2B and 3, except for the first structure, the first and second gate insulation patterns, and the thickness of the second insulation pattern. Thus, like reference numerals may refer to like elements below, and duplicative descriptions may be omitted below.

Referring to FIGS. 23A and 23B, the vertical memory device need not include the lower channel 150 and the first and second gate insulation patterns 270 and 275, as described with reference to FIG. 20.

The second insulation pattern 264 may have a thickness (e.g., in the first direction) substantially equal to that of each of the third and fifth insulation patterns 266 and 269.

In an exemplary embodiment of the present inventive concept, the lower and upper surfaces of the second insulation pattern 264 may be bent upwardly along the first direction. For example, each of opposite ends of the second insulation pattern 264 in the third direction (e.g., each portion of the second insulation pattern 264 adjacent the second opening 250) may be bent upwardly along the first direction, similar to the second insulation pattern 264 in FIGS. 1, 2A, 2B and 3. For example, the lower surface of the second insulation pattern 264 may be spaced apart by the first distance D1 from the plane extending from the lower surface of other portions (e.g., the central portion of the second insulation pattern 264 extending in the direction parallel to the upper surface of the substrate 100), and the upper surface of the second insulation pattern 264 may be spaced apart by the second distance D2 from the plane extending from the upper surface of the central portion of the second insulation pattern 264. The first distance D1 may be greater than the second distance D2.

However, the thickness of the second insulation pattern 264 may be less than that of the second insulation pattern 264 described with reference to FIGS. 1, 2A, 2B and 3, and thus the difference between the first and second distances D1 and D2 may be relatively small. Additionally, the first length L1 of the lower surface of each of the opposite ends of the second insulation pattern 264 may be greater than the second length L2 of the upper surface of each of the opposite ends of the second insulation pattern 264, however, the difference between the first and second lengths L1 and L2 may be relatively large. The sidewall of the second insulation pattern 264 connecting the lower and upper surfaces of the opposite ends of the second insulation pattern 264 need not be substantially perpendicular to the upper surface of the substrate 100, but may be slanted with respect to the upper surface of the substrate 100.

Accordingly, as the lower surface of the second insulation pattern 264 is bent upwardly, when the first gate electrode 332 serving as a GSL is formed under the second insulation pattern 264, the source gas may be easily provided into the first gap 252 (see, e.g., FIGS. 24 and 25), and thus the first gate electrode 332 may be formed without defects and a manufacturing yield of the vertical memory device according to an exemplary embodiment of the present inventive concept may be increased.

The second insulation pattern 264 may have a thickness in the first direction substantially equal to that of each of the third insulation patterns 266, and thus lower ones of the third insulation patterns 266 may have lower and upper surfaces bent upwardly in the first direction, due to the characteristics in that the slope of the second opening 250 may gradually decrease from a top toward a bottom thereof.

Accordingly, for example, the lower two of the third insulation patterns 266 may have lower and upper surfaces bent upwardly in the first direction. For example, the lower and upper surfaces of the lowermost one of the third insulation patterns 266 may be spaced apart from standard planes by third and fourth distances D3 and D4, respectively, and opposite ends of the lowermost one of the third insulation patterns 266 may have third and fourth lengths L3 and L4, respectively, in the third direction. The third distance D3 may be greater than the fourth distance D4, and the third length L3 may be greater than the fourth length L4. Accordingly, the sidewall connecting the lower and upper surfaces of the lowermost one of the third insulation patterns 266 may have a slope less than 90 degrees with respect to the upper surface of the substrate 100.

Similarly, lower and upper surfaces of a second one of the third insulation patterns 266 at a second level above the lowermost one of the third insulation patterns 266 may be spaced apart from standard planes by fifth and sixth distances D5 and D6, respectively, and opposite ends of the second one of the third insulation patterns 266 may have fifth and sixth lengths L5 and L6, respectively, in the third direction. The fifth distance D5 may be greater than the sixth distance D6, and the fifth length L5 may be greater than the sixth length L6. Accordingly, the sidewall connecting the lower and upper surfaces of the second one of the third insulation patterns 266 may have a slope less than 90 degrees with respect to the upper surface of the substrate 100.

In an exemplary embodiment of the present inventive concept, the bending force of the gate electrodes may be weakened from a lower level toward an upper level, according to the slope change of the sidewall of the second opening 250. For example, the bending force of the second insulation pattern 264 may be greatest, and the bending force of the second one of the third insulation patterns 266 may be smallest. Accordingly, the sidewall of the second insulation pattern 264 facing the second opening 250 may have a smallest slope among the sidewalls of the first to fifth insulation patterns 262, 264, 266, 268 and 269 with respect to the upper surface of the substrate 100. However, the bending force of the second insulation pattern 264 described with reference to FIGS. 23A and 23B may be smaller than that of the second insulation pattern 264 described with reference to FIGS. 1, 2A, 2B and 3 having the thicker thickness.

Figure 24:
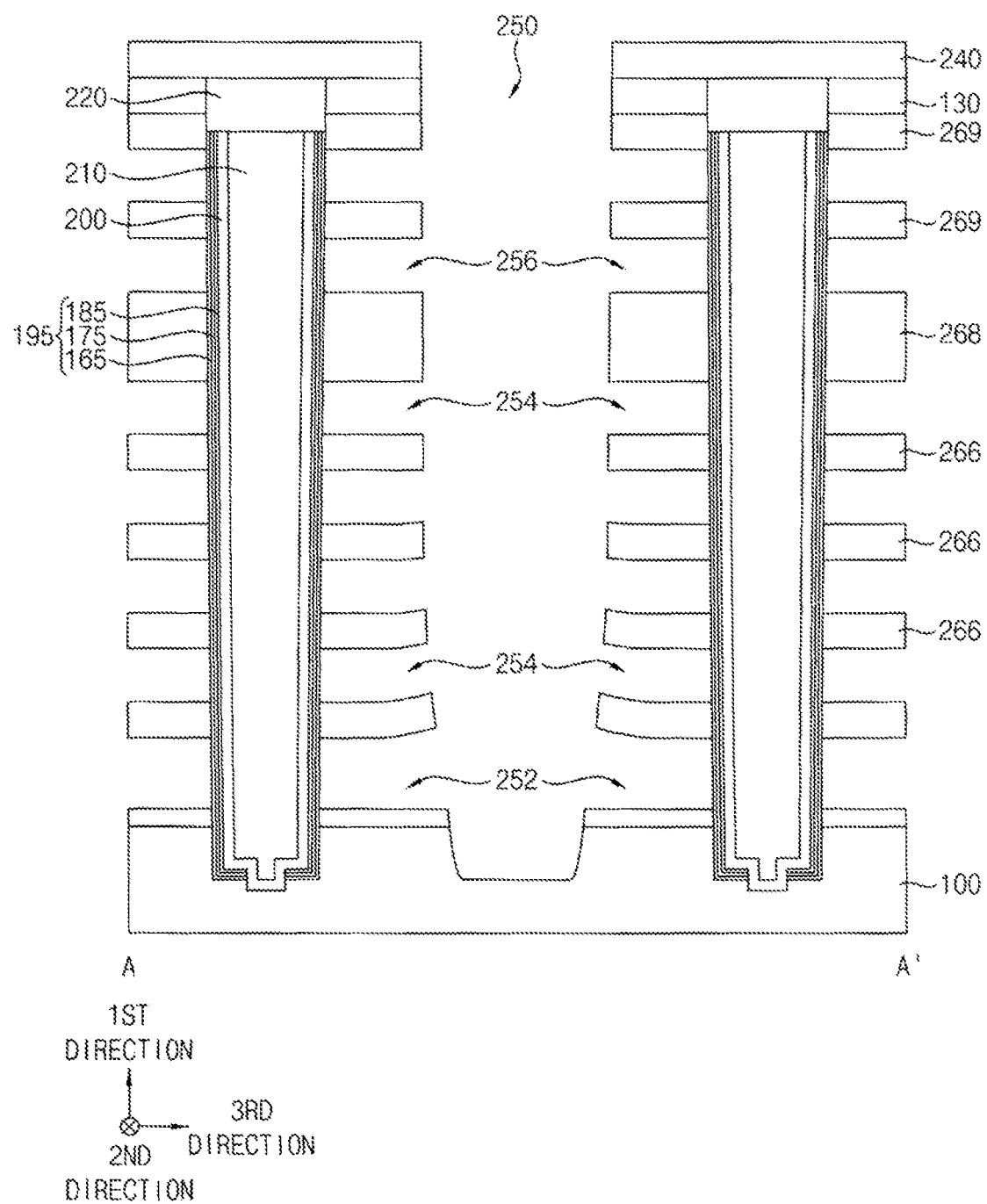
FIGS. 24 and 25 are cross-sectional views illustrating a method of manufacturing the semiconductor device of FIGS. 23A and 23B.
Figure 25:
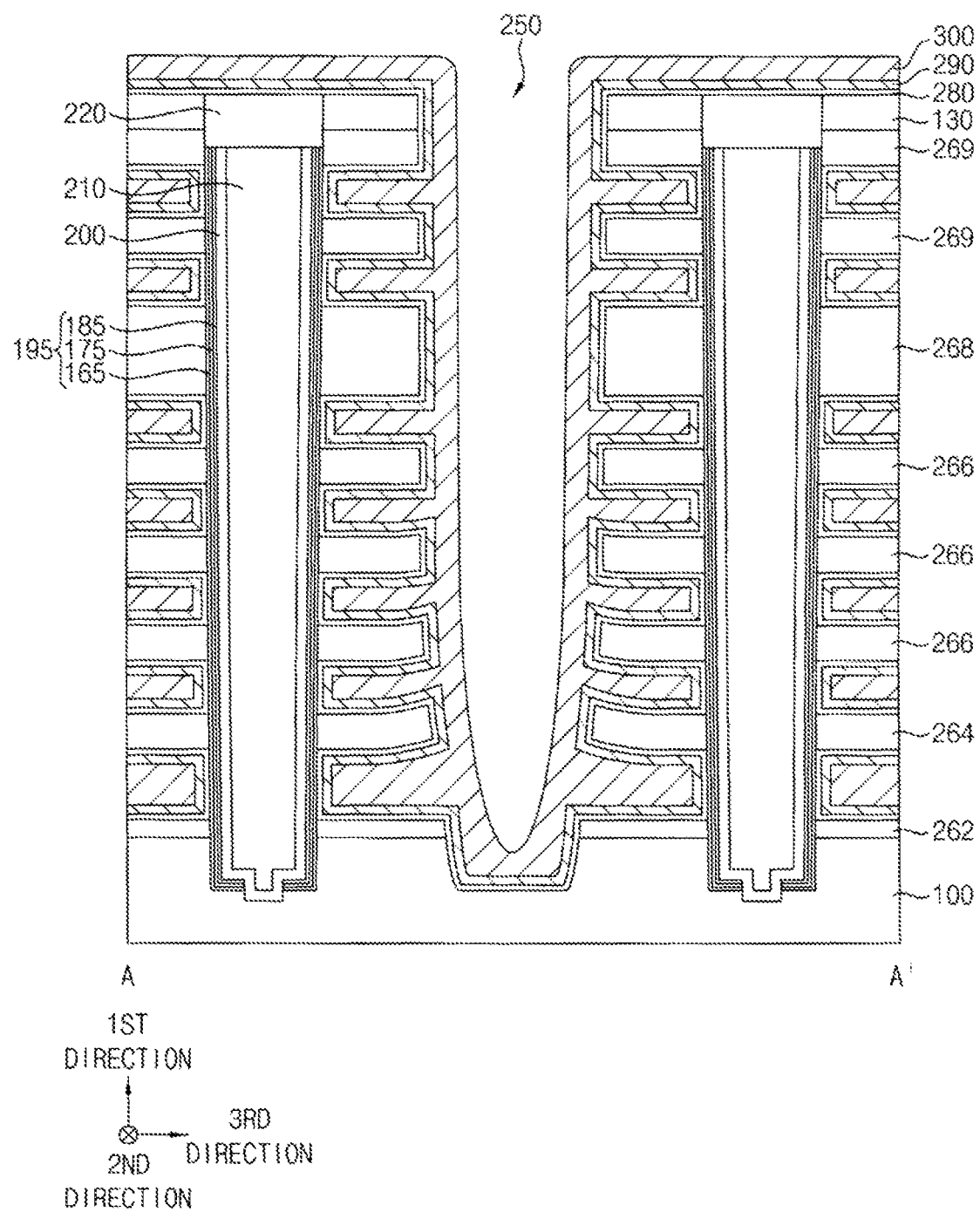

FIGS. 24 and 25 are cross-sectional views illustrating a method of manufacturing the semiconductor device of FIGS. 23A and 23B. This method may include processes substantially the same as or similar to those described above with reference to FIGS. 4 to 19, and thus duplicative descriptions may be omitted below.

Referring to FIG. 24, processes substantially the same as or similar to those described above with reference to FIGS. 4 to 6 may be performed, and processes substantially the same as or similar to those described above with reference to FIGS. 8 to 15 may be performed.

Thus, the lower channel 150 might not be formed on the upper surface of the substrate 100, and the upper channel 200, the charge storage structure 195 and the filling pattern 210 may be in direct contact with the upper surface of the substrate 100.

However, the second insulation layer 114 may have a thickness substantially equal to that of the third insulation layer 116 or the fifth insulation layer 119.

The sidewall of the second opening 250 may have a slope gradually decreasing from a top toward a bottom thereof, and thus, for example, the slopes of sidewalls of the first and second insulation patterns 262 and 264 and lower two of the third insulation patterns 266 may be less than those of sidewalls of upper ones of the third insulation patterns 266 and the fourth and fifth insulation patterns 268 and 269.

Referring to FIG. 25, processes substantially the same as or similar to those described above with reference to FIG. 17 may be performed.

In an exemplary embodiment of the present inventive concept, lower and upper surfaces of the second insulation pattern 264 and the lower two of the third insulation patterns 266 may be bent upwardly in the first direction, and the inlet of at least the first gap 252, which may be formed at a lowermost level of the gate electrodes, may be enlarged. Thus, the source gas for forming the gate conductive layer may be easily provided into the first gap 252.

Referring to FIGS. 23A and 23B again, processes substantially the same as or similar to those described with reference to FIGS. 18 to 19, and FIGS. 1, 2A, 2B and 3 may be performed to complete the fabrication of the vertical memory device.

While example embodiments have been particularly shown and described, it will be understood by one of ordinary skill in the art that variations in form and detail may be made therein without departing from the spirit and scope of the present invention.

What is claimed is:

1. A vertical memory device, comprising:
a gate electrode structure including gate electrodes spaced apart from each other on a substrate in a first direction substantially perpendicular to an upper surface of the substrate, each of the gate electrodes extending in a second direction substantially parallel to the upper surface of the substrate;
an insulation pattern structure including insulation patterns, each of the insulation patterns extending in the second direction between adjacent gate electrodes of the gate electrodes; and
a channel structure extending in the first direction on the substrate, the channel structure extending through at least a portion of the gate electrode structure and at least a portion of the insulation pattern structure,
wherein the gate electrode structure includes at least one first gate electrode and a plurality of second gate electrodes sequentially stacked in the first direction on the substrate,
wherein an upper surface of an end portion of the at least one first gate electrode is not parallel to a lower surface of the end portion of the at least one first gate electrode, and
wherein a sidewall connecting an upper surface and a lower surface of a first insulation pattern is slanted with respect to the upper surface of the substrate, the first insulation pattern being between the at least one first gate electrode and a lowermost second gate electrode of the plurality of second gate electrodes.

2. The vertical memory device of claim 1, wherein the insulation pattern structure further includes second insulation patterns, each of the second insulation patterns being between adjacent second gate electrodes of the plurality of second gate electrodes, and wherein an angle of a slope of a sidewall of a lowermost second insulation pattern of the second insulation patterns is greater than an angle of a slope of the sidewall of the first insulation pattern with respect to the third direction upper surface of the substrate.

3. The vertical memory device of claim 2, wherein a thickness of the first insulation pattern in the first direction is greater than a thickness of each of the second insulation patterns in the first direction.

4. The vertical memory device of claim 1, wherein a sidewall of the at least one first gate electrode has a thickness in the first direction greater than a thickness of a central portion in a third direction of the at least one first gate electrode.

5. The vertical memory device of claim 4, wherein a sidewall of the lowermost second gate electrode of the plurality of second gate electrodes has a thickness in the first direction smaller than a thickness of the sidewall of the at least one first gate electrode.

6. The vertical memory device of claim 1, wherein the channel structure includes:
a lower channel protruding from the upper surface of the substrate in the first direction; and
an upper channel extending in the first direction on the lower channel,
wherein the lower channel extends through the at least one first gate electrode, and the upper channel extends through the plurality of second gate electrodes.

7. The vertical memory device of claim 6, further comprising a first gate insulation pattern between the at least one first gate electrode and the lower channel, the first gate insulation pattern including silicon oxide.

8. The vertical memory device of claim 7, further comprising a second gate insulation pattern between the at least one first gate electrode and the upper surface of the substrate, the second gate insulation pattern including silicon oxide.

9. The vertical memory device of claim 1, wherein the gate electrode structure further includes at least one third gate electrode spaced apart from and above an uppermost second gate electrode of the plurality of second gate electrodes, and wherein the at least one first gate electrode, the plurality of second gate electrodes, and the at least one third gate electrode serve as a ground selection line (GSL), a word line and a string selection line (SSL), respectively.

10. The vertical memory device of claim 9, wherein the at least one first gate electrode is disposed at a first level, and the at least one third gate electrode includes at least two third gate electrodes disposed at two different levels above the first level.

11. The vertical memory device of claim 1, wherein the at least one first gate electrode and the plurality of second gate electrodes are disposed in a third direction, and wherein the vertical memory device further comprises a common source line (CSL) extending in the second direction between neighboring gate electrodes of the at least one first gate electrode and the plurality of second gate electrodes in the third direction, the CSL being spaced apart from the neighboring ones of the at least one first gate electrode and the plurality of second gate electrodes in the third direction. electrodes in the third direction.

12. A vertical memory device, comprising:
a gate electrode structure including gate electrodes spaced apart from each other on a substrate in a first direction substantially perpendicular to an upper surface of the substrate, each of the gate electrodes extending in a second direction substantially parallel to the upper surface of the substrate;
an insulation pattern structure including insulation patterns, each of the insulation patterns extending in the second direction between the gate electrodes; and
a channel structure extending in the first direction on the substrate, the channel structure extending through at least a portion of the gate electrode structure and at least a portion of the insulation pattern structure,
wherein the gate electrode structure includes a first gate electrode and a plurality of second gate electrodes sequentially stacked in the first direction on the substrate, and
wherein a first ratio of a thickness in the first direction of a sidewall of the first gate electrode with respect to a thickness in the first direction of a central portion of the first gate electrode in a third direction substantially parallel to the upper surface of the substrate and substantially perpendicular to the second direction is greater than a second ratio of a thickness in the first direction of a sidewall of each respective gate electrode of the plurality of second gate electrodes with respect to a thickness in the first direction of a central portion of each respective gate electrode of the plurality of second gate electrodes in the third direction.

13. The vertical memory device of claim 12, wherein the upper surface and the lower surface of the first insulation pattern of the insulation patterns are bent in a direction away from the upper surface of the substrate.

14. The vertical memory device of claim 12, wherein the insulation pattern structure further includes second insulation patterns, each of the second insulation patterns being between adjacent second gate electrodes of the plurality of second gate electrodes of the gate electrode structure, and wherein an angle of a slope of a sidewall of a lowermost second insulation pattern of the second insulation patterns is greater than an angle of a slope of the sidewall of the first insulation pattern with respect to the third direction.

15. The vertical memory device of claim 14, wherein a thickness of the first gate electrode of the gate electrodes in the first direction is greater than a thickness of each of the second gate electrodes of the plurality of second gate electrodes of the gate electrodes in the first direction, and wherein a thickness of the first insulation pattern in the first direction is greater than a thickness of each of the second insulation patterns in the first direction.

16. A vertical memory device, comprising:
gate electrodes spaced apart from each other on a substrate in a first direction substantially perpendicular to an upper surface of the substrate, each of the gate electrodes extending in a second direction substantially parallel to the upper surface of the substrate;
insulation patterns, each of the insulation patterns extending in the second direction between adjacent gate electrodes of the gate electrodes; and
a channel extending in the first direction on the substrate, the channel extending through at least one gate electrode of the gate electrodes and at least one insulation pattern of the insulation patterns,
wherein a distance from the upper surface of the substrate to a lower surface of an end portion in a fourth direction of a first insulation pattern of the insulation patterns is greater than a distance from the upper surface of the substrate to a lower surface of a central portion in a third direction of the first insulation pattern of the insulation patterns, and
wherein a sidewall connecting an upper surface and a lower surface of the first insulation pattern of the insulation patterns is slanted with respect to the upper surface of the substrate.

17. The vertical memory device of claim 16, wherein each of second insulation patterns of the insulation patterns above the first insulation pattern has lower and upper surfaces that are substantially flat, and wherein an angle of a slope of a sidewall connecting the lower and upper surfaces of a lowermost second insulation pattern of the second insulation patterns is greater than an angle of a slope of a sidewall connecting the lower and upper surfaces of the first insulation pattern.

18. The vertical memory device of claim 1, wherein the upper surface of the first insulation pattern of the insulation patterns curves away from the upper surface of the substrate along the first direction.

19. The vertical memory device of claim 1, wherein the lower surface of the first insulation pattern of the insulation patterns is in an arc shape.

20. The vertical memory device of claim 16, wherein the lower surface of the first insulation pattern of the insulation patterns is in an arc shape.

* * * * *